United States Patent
Chu

(10) Patent No.: US 7,429,748 B2
(45) Date of Patent: Sep. 30, 2008

(54) HIGH SPEED GE CHANNEL HETEROSTRUCTURES FOR FIELD EFFECT DEVICES

(75) Inventor: Jack O. Chu, Manhasset Hill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/548,153

(22) Filed: Oct. 10, 2006

(65) Prior Publication Data

US 2007/0187716 A1 Aug. 16, 2007

Related U.S. Application Data

(62) Division of application No. 09/936,320, filed on Sep. 12, 2001, now Pat. No. 7,145,167.

(51) Int. Cl.
  *H01L 29/06* (2006.01)
(52) U.S. Cl. .............................. 257/19; 257/18; 257/22
(58) Field of Classification Search .................... 257/19
See application file for complete search history.

(56) References Cited

U.S. PATENT DOCUMENTS

| | | |
|---|---|---|
| 5,019,882 A | 5/1991 | Solomon et al. |
| 5,241,197 A | 8/1993 | Murakami et al. |
| 5,259,918 A | 11/1993 | Akbar et al. |
| 5,298,452 A | 3/1994 | Meyerson et al. |
| 5,534,713 A | 7/1996 | Ismail et al. |
| 5,659,187 A | 8/1997 | Legoues et al. |
| 7,145,167 B1 * | 12/2006 | Chu .............................. 257/19 |

FOREIGN PATENT DOCUMENTS

JP 05121450 A 5/1993

OTHER PUBLICATIONS

R. People and J. C. Bean, "Band Alignments Of Coherently Strained Gex Si1-X / Si Heterostructures on <001> GeySi1-y Substrates," Appl. Phys. Lett., Feb. 24, 1986, pp. 538-539, 48 (8).

(Continued)

*Primary Examiner*—Long Pham
(74) *Attorney, Agent, or Firm*—Scully, Scott, Murphy & Presser, P.C.; Robert M. Trepp, Esq.

(57) ABSTRACT

A method and a layered heterostructure for forming high mobility Ge channel field effect transistors is described incorporating a plurality of semiconductor layers on a semiconductor substrate, and a channel structure of a compressively strained epitaxial Ge layer having a higher barrier or a deeper confining quantum well and having extremely high hole mobility for complementary MODFETs and MOSFETs. The invention overcomes the problem of a limited hole mobility due to alloy scattering for a p-channel device with only a single compressively strained SiGe channel layer. This invention further provides improvements in mobility and transconductance over deep submicron state-of-the art Si pMOSFETs in addition to having a broad temperature operation regime from above room temperature (425 K) down to cryogenic low temperatures (0.4 K) where at low temperatures even high device performances are achievable.

12 Claims, 17 Drawing Sheets

OTHER PUBLICATIONS

G. Hock et al., "High Performance 0.25μm ρ-Type Ge/SiGe MODFETs," Elect. Lett., Sep. 17, 1998, pp. 1888-1889, vol. 34, No. 19.

U. Konig and F. Schaffler, "ρ-Type Ge-Channel MODFETs With High Transconductance Grown on Si Substrates," IEEE Elect. Dev. Lett., Apr. 1993, pp. 205-207, vol. 14, No. 4.

M. Arafa, "A 70-GHz $f_T$ Low Operating Bias Self-Aligned ρ-Type SiGe MODFET," IEEE Elect. Dev. Lett., Dec. 1996, pp. 586-588, vol. 17, No. 12.

U. Kong et al., "SiGe HBTs and HFETs," iEEE Sol. Sta. Elect., Elsevier, 1995, pp. 1595-1 602,vol. 38, No. 9.

Milind Gokhale et al., "Enhanced Performance of PMOS and CMOS Circuits Using Self-Aligned MOSFETs With Modulation Doped Si-Ge Channel," IEEE, Proc. Ten. Bien. Univ. Govt./Ind. Micro. Symp., May 18-19, 1993, pp. 219-222, US, New York.

David W. Greve, "Field Effect Devices And Applications," Chap. 8; Structure Of The GaAs MESFET, Table 8.1, Prentice-Hall, Inc; Simon & Schuster/ A Viacom Company, 1998, p. 315, Upper Saddle River, NJ, 07458.

* cited by examiner

HIGH SPEED GE CHANNEL HETEROSTRUCTURES FOR FIELD EFFECT DEVICES

RELATED APPLICATIONS

This application is a divisional of U.S. application Ser. No. 09/936,320, filed Sep. 12, 2001. This application is cross-referenced to Ser. No. 09/267,323 filed Mar. 12, 1999 by Jack O. Chu et al. entitled "High Speed Composite p-channel Si/SiGe Heterostructure for Field Effect Devices" which describes a field effect transistor with a channel having a composite layer of a layer of Ge and a layer of SiGe both under compression to obtain higher mobility which is incorporated herein by reference.

FIELD OF THE INVENTION

This invention relates to a silicon and silicon germanium based materials system and more specifically, to a novel epitaxial field effect transistor structure useful for high-speed low-noise, microwave, submillimeter-wave and millimeter-wave applications. Preferably, the epitaxial field effect transistor structure includes a high performance Ge channel in a structure incorporating silicon and silicon germanium layers to form CMOS devices or circuits, high electron mobility transistors (HEMT's), and modulation-doped heterostructure field effect transistors. This invention provides improvements in mobility and transconductance over deep submicron (0.1 um channel length) state-of-the-art Si pMOSFETs by using an extremely high mobility Ge channel device which can be advantageously operated in a broad temperature regime from above room temperature (373 K) to cryogenic temperatures (0.4 K) where even higher device performances are achievable.

BACKGROUND OF THE INVENTION

In high speed and low noise device applications, the focus has been on designing and fabricating high electron mobility transistors (HEMTs) or modulation-doped field effect transistors (MODFETs) where carrier (eg. electrons, holes) conduction occurs in an undoped channel layer such that the carrier mobility is not limited by impurity scattering and high carrier mobility is achieved. In general, these high speed electronic devices are often used as low-noise amplifiers, power amplifiers, satellite receivers and transmitters operating in the microwave and rf regime, and the material of choice is usually the faster but more expensive III-V materials system and technology such as GaAs and InP. A complicated and costly III-V materials technology is not very desirable in the semiconductor industry whereas a less-expensive SiGe materials system which is fully compatible with present Si technology is more desirable and far easier to integrate with existing Si-CMOS device technology.

One example of a material system compatible with Si technology is described in U.S. Pat. No. 5,019,882 which issued on May 28, 1991 to P. M. Solomon entitled "Germanium Channel Silicon MOSFET" and assigned to the assignee herein. In U.S. Pat. No. 5,019,882, a channel having improved carrier mobility comprises an alloy layer of silicon and germanium which is grown above a silicon substrate. The alloy layer is kept thin enough for proper pseudomorphic dislocation free growth to occur. A layer of silicon is formed over the alloy layer and is oxidized partially through to form a dielectric layer. A gate region is formed over the silicon dioxide.

A second example of a high performance SiGe device structure compatible with Si technology, is described in U.S. Pat. No. 5,534,713 which issued on Jul. 9, 1996 to K. E. Ismail entitled "Complementary Metal-Oxide Semiconductor Transistor Logic Using Strained Si/SiGe Heterostructure Layers" and assigned to the assignee herein. In U.S. Pat. No. 5,534,713 a silicon CMOS transistor structure is described utilizing a buried SiGe channel under compressive strain with enhanced hole mobility for a p-channel device, and a buried Si channel under tensile strain with enhanced electron mobility for an n-channel device fabricated on a strained Si/SiGe heterostructure design. Further in U.S. Pat. No. 5,534,713 the proposed compressively-strained SiGe layer serving as a p-channel for the p-channel field effect transistor is described as having a composition of germanium in the range from 50 to 100% and with a preferred composition of 80%. Thus far, prototype SiGe p-channel MODFETs utilizing this channel design and composition at the Thomas J Research Center, IBM Corporation have yielded hole mobilities only up to 1,000 $cm^2/Vs$ at room temperature.

The compatibility and fabrication of a Ge-channel MODFET using existing Si technology has been demonstrated by molecular beam epitaxy (MBE) techniques where modulation-doped FET structures with hole channels consisting of a pure Ge layer were grown by molecular beam epitaxy on a Si substrate. In particular, room temperature hole mobility for a two-dimensional hole gas (2DHG) in a modulation-doped, strained Ge layer (grown by MBE) has been reported as high as 1,870 $cm^2/Vs$ in a publication by G. Höck, T. Hackbarth, U. Erben, E. Kohn and U. König entitled "High performance 0.25 μm p-type Ge/SiGe MODFETs", Electron. Lett. 34 (19), 17 Sep. 1998, pp 1888-1889 which is incorporated herein by reference. In G. Höck et al., for the 0.25 μm gate length devices, the p-type Ge channel MODFETs exhibited a maximum DC extrinsic transconductances of 160 mS/mm while the maximum drain saturation current reached up to a high value of 300 mA/mm. For the RF performance, a unity current gain cutoff frequency $f_T$ of 32 GHz and a maximum frequency oscillation $f_{max}$ of 85 GHz were obtained.

There is a growing interest in designing and fabricating high speed low temperature MOSFETs and bipolar transistors for high speed cryogenic applications such as read out electronics for cooled infrared detectors, fast processors, and low noise amplifiers. To this end, a Ge channel device structure which can be operated in the temperature range from room temperature (300 K) down to cyrogenic temperature (<T=77 K) while having even higher transport characteristic is the ideal solution. An example of a modulation-doped SiGe/Ge heterostructures with a 2D hole channel consisting of pure Ge which is operable at both room temperature and at 77 K has been reported in a publication by "U. König and F. Schaffler entitled "p-Type Ge-Channel MODFET's with High Transconductance Grown on Si Substrates", Electron. Dev. Lett. 14 (4), 4 Apr. 1993, pp 205-207 which is incorporated herein by reference.

Another example of a field effect transistor having a high carrier mobility suitable for high speed and low temperature operation is described in U.S. Pat. No. 5,241,197 which issued on Aug. 31, 1993 to E. Murakami et al entitled "Transistor Provided with Strained Germanium Layer". In U.S. Pat. No. 5,241,197, a strain control layer grown by molecular beam epitaxy is provided beneath a germanium layer to impose a compressive strain on the germanium layer. The composition of the strain control layer is used to generate the compressive strain. The carrier mobility in the strained germanium layer is reported to be 3000 $cm^2/Vs$. However, no measurements or data have been subsequently published of Ge properties or Ge layered structures with mobilities over 2000 cm$^2$/Vs at room temperature. Reported values of hole mobilities of Ge layered structures at room temperature of 1900 cm$^2$/Vs are found on page 315 and specifically in Table 8.1 of D. W. Greve, *Field Effect Devices and Applications* published in 1998 by Prentice-Hall, Inc. Upper Saddle River, N.J.

SUMMARY OF THE INVENTION

In accordance with the present invention, a silicon and silicon germanium based epitaxial structure for a p-type field-effect transistor that utilizes a single layer of Ge in a p-channel region is described for forming a p-channel device comprising a semiconductor substrate, a first layer of relaxed $Si_{1-x}Ge_x$ formed epitaxially on the substrate where the Ge fraction x is in the range from 0.5 to 0.8, a second layer of p-doped $Si_{1-x}Ge_x$ formed epitaxially on the first layer, a third layer of undoped $Si_{1-x}Ge_x$ formed epitaxially on the second layer, a fourth layer of undoped $Si_{1-x}Ge_x$ formed epitaxially on the third layer, a fifth layer of undoped $Si_{1-x}Ge_x$ formed epitaxially on the fourth layer, the third through fifth layers having a progressively lower value of x and a lower value of residual background concentration of p dopant, a sixth layer of undoped Ge formed epitaxially on the fifth layer whereby the Ge layer is under compressive strain and remains commensurate with respect to the first relaxed $Si_{1-x}Ge_x$ layer, and a seventh layer of undoped $Si_{1-x}Ge_x$ formed epitaxially on the sixth layer. A metal layer may be formed and patterned over the seventh layer to form the gate of the p-channel field effect transistors while the drain and source regions may be formed by forming p regions on either side of the gate in the layered structure. This layered structure design forms a modulation-doped heterostructure whereby the supply layer or the second p-doped $Si_{1-x}Ge_x$ layer is located below the active Ge channel, the sixth layer. Furthermore, in this layered device structure, the spacer layer which separates the active channel from the supply layer employs a triple layer design comprising the third layer of undoped $Si_{1-x}Ge_x$, the fourth layer of undoped $Si_{1-x}Ge_x$, and a fifth layer of undoped $Si_{1-x}Ge_x$ of progressively a lower value of x and a lower value of residual background concentration of p-type dopant. The progressively lower background dopant can be obtained by forming undoped $Si_{1-x}Ge_x$ at a progressively lower temperature.

The invention further provides a method and a p-channel field effect transistor having extremely high hole mobility in its channel comprising a semiconductor substrate, a first layer of relaxed $Si_{1-x}Ge_x$ formed epitaxially on the substrate where x is in the range from 0.5 to 0.8, a second layer of p-doped $Si_{1-x}Ge_x$ formed epitaxially on the first layer, a third layer of undoped $Si_{1-x}Ge_x$ formed epitaxially on the second layer, a fourth layer of undoped $Si_{1-x}Ge_x$ formed epitaxially on the third layer, the third and fourth layers having a progressively lower value of x and a lower value of residual background concentration of p-type dopant, a fifth layer of undoped Ge formed epitaxially on the fourth layer whereby the Ge layer is commensurate with respect to the first relaxed $Si_{1-x}Ge_x$ layer, and a sixth layer of undoped $Si_{1-x}Ge_x$ formed epitaxially on the fifth layer. This layered structure design describes a modulation-doped heterostructure whereby the supply layer or the p-doped $Si_{1-x}Ge_x$ layer of layer 2 is separated from the active p-channel of the fifth layer by a double layer spacer design of the third and fourth $Si_{1-x}Ge_x$ layers.

The invention further provides a method and a p-channel field effect transistor having extremely high hole mobility in its channel comprising a semiconductor substrate, a first layer of relaxed $Si_{1-x}Ge_x$ formed epitaxially on the substrate where x is in the range from 0.5 to 0.8, a second layer of undoped Ge formed epitaxially on the first layer whereby the Ge layer is commensurate with respect to the first relaxed $Si_{1-x}Ge_x$ layer, a third layer of undoped $Si_{1-x}Ge_x$ formed epitaxially on the second layer, a fourth layer of undoped $Si_{1-x}Ge_x$ formed epitaxially on the third layer, a fifth layer of undoped $Si_{1-x}Ge_x$ formed epitaxially on the fourth layer, and a sixth layer of p-doped $Si_{1-x}Ge_x$ formed epitaxially on the fifth layer. This layered structure design describes a modulation-doped heterostructure whereby the supply layer or the sixth layer of p-doped $Si_{1-x}Ge_x$ layer is located above the active Ge channel of layer 2. Likewise, the supply layer or the p-doped $Si_{1-x}Ge_x$ layer of layer 6 can be further separated above the active Ge channel of the second layer with the addition of a strained Si spacer layer between the fifth layer and sixth layer, or alternatively between the fourth layer and fifth layer.

The invention further provides a method and a p-channel field effect transistor having extremely high hole mobility in its channel comprising a semiconductor substrate, a first layer having an upper surface of relaxed $Si_{1-x}Ge_x$ formed epitaxially on the substrate where x is in the range from 0.5 to 0.8, a second layer of p-doped $Si_{1-x}Ge_x$ formed epitaxially on the first layer, a third layer of undoped $Si_{1-x}Ge_x$ formed epitaxially on the second layer, a fourth layer of undoped $Si_{1-x}Ge_x$ formed epitaxially on the third layer, a fifth layer of undoped Ge formed epitaxially on the fourth layer whereby the Ge layer is commensurate with respect to the upper surface of the first relaxed $Si_{1-x}Ge_x$ layer, a sixth layer of undoped $Si_{1-x}Ge_x$ formed epitaxially on the fifth layer, a seventh layer of undoped $Si_{1-x}Ge_x$ formed epitaxially on the sixth layer, and an eight layer of p-doped $Si_{1-x}Ge_x$ formed epitaxially on the seventh layer. This layered structure design describes a modulation-doped heterostructure whereby the active channel is symmetrically doped by two supply layers of the second and eighth layers located above and below the fifth channel layer and equally separated by a dual layer spacer design of the sixth and seventh layers above the channel, and the third and fourth layers below the channel respectively.

The invention further provides a method and a p-channel field effect transistor having extremely high hole mobility in its channel comprising a semiconductor substrate, a first layer having an upper surface of relaxed $Si_{1-x}Ge_x$ formed epitaxially on the substrate where x is in the range from 0.5 to 0.8, a second layer of p-doped $Si_{1-x}Ge_x$ formed epitaxially on the first layer, a third layer of undoped $Si_{1-x}Ge_x$ formed epitaxially on the second layer, a fourth layer of undoped $Si_{1-x}Ge_x$ formed epitaxially on the third layer, a fifth layer of undoped $Si_{1-x}Ge_x$ formed epitaxially on the fourth layer, a sixth layer of undoped Ge formed epitaxially on the fifth layer whereby the Ge layer is commensurate with respect to the upper surface of the first relaxed $Si_{1-x}Ge_x$ layer, a seventh layer of undoped $Si_{1-x}Ge_x$ formed epitaxially on the sixth layer, an eight layer of undoped $Si_{1-x}Ge_x$ formed epitaxially on the seventh layer, and a ninth layer of p-doped $Si_{1-x}Ge_x$ formed epitaxially on the eighth layer. This layered structure design describes a modulation-doped heterostructure whereby the active channel is asymmetrically doped by two supply layers of 2 and 9 located above and below the channel layer 5 and unequally separated by a dual layer spacer design of the seventh and eighth layers above the channel, and a triple layer spacer design of the fifth, fourth and third layers below the channel respectively. Likewise, the asymmetrically doping can be accomplish by the reversed spacer layer design whereby the top supply layer is separated by a triple layer design above the channel while the bottom supply layer is separated by a dual layer spacer design below the channel.

The invention further provides a method and a complementary field effect transistor having extremely high hole mobility in its channel comprising a semiconductor substrate, a first layer having an upper surface of relaxed $Si_{1-x}Ge_x$ formed epitaxially on the substrate where x is in the range from 0.5 to 0.8, a second layer of undoped Ge formed epitaxially on the first layer whereby the Ge layer is commensurate with respect to the upper surface of the first relaxed $Si_{1-x}Ge_x$ layer, a third layer of undoped $Si_{1-x}Ge_x$ formed epitaxially on the second layer, and a fourth layer of gate dielectric formed over the third layer. A doped polysilicon layer may be formed and patterned over the fourth layer to form the gate electrode of the field effect transistor while the source and drain regions may be formed by implanting either self aligned p-type or n-type regions on either side of the gate electrode in the layered structure. This layered structure design describes the formation of a near surface Ge channel with high mobilities suitable for complementary (CMOS) field effect transistors for operation in the enhancement mode.

The invention further provides a method and a structure for a relaxed (>90%) $Si_{1-x}Ge_x$ buffer layer comprising a semiconductor substrate, a first layer of partially relaxed (<50%) $Si_{1-x}Ge_x$ formed epitaxially by stepwise grading (or linear grading) where the Ge content of the layers is increased in a stepwise fashion (or a linear fashion) on the substrate and x is in the range from about 0.1 to about 0.9, a second layer of $Si_{1-y}Ge_y$ formed epitaxially on the first layer where y=x+z and z is in the range of 0.01 to 0.1 which serves to "over relax" the layer to greater than x, and a third layer of $Si_{1-x}Ge_x$ formed epitaxially on the second layer whereby the $Si_{1-x}Ge_x$ layer is now more relaxed as compared to the original, partially relaxed $Si_{1-x}Ge_x$ layer one. The extent of additional relaxation due to this "over shoot" layer of $Si_{1-y}Ge_y$ does depend on the thickness of this layer which in turn would be limited by its critical thickness on the initial partially relaxed $Si_{1-x}Ge_x$ layer. In the case when x is greater than 0.5 a double "over shoot" effect is preferred whereby the first "over shoot" is a $Si_{1-m}Ge_m$ layer where m=0.5x, and the second "over shoot" is a $Si_{1-n}Ge_n$ layer where n=x+z and z is in the range of 0.01 to 0.1.

It is an object of the invention to provide a layered structure which allows for p-channel field effect transistors to be formed having a channel with extremely high hole mobility.

It is a further object of the invention to provide a p-channel device where the active channel is a strained Ge layer.

It is a further object of the invention to provide p-channel devices where the channel structure takes advantage of the higher compressive strain with the benefits of a higher barrier or a deeper confining channel for hole carriers as compared to a replacement channel using a single SiGe layer.

It is a further object of the invention to provide a buried channel of a Ge layer under compressive strain for a p-channel device.

It is a further object of the invention to provide a hole mobility of greater than 1,000 cm²/Vs in an optimum p-channel structure composed of a strained Ge layer of 100-200 Å thick to produce the highest hole mobility in the SiGe materials system.

It is a further object of the invention to provide a p-channel device where the spacer layer is a triple or dual layer design composed of either three or two SiGe layers respectively.

It is a further object of the invention to provide a p-channel device where the active channel is symmetrically doped by two supply layers located above and below the channel with a symmetrical dual spacer layer design.

It is a further object of the invention to provide a p-channel device where the active channel is asymmetrically doped by two supply layers located above and below the channel with an asymmetrical spacer layer design.

It is a further object of the invention to provide a near surface channel device where the active Ge channel has high electron and hole mobilities and may be operated in the enhancement mode.

It is a further object of the invention to provide a near surface channel device where the active Ge channel is suitable for making complementary MOSFET devices having high mobilities.

It is a further object of the invention to provide a layered structure and scheme where a desired relaxed $Si_{1-x}Ge_x$ layer can be better achieved by the addition of a single over shoot layer (when x £0.5) or a double overshoot (when x>0.5) in the grade-up composition of the SiGe buffer structure.

BRIEF DESCRIPTION OF THE DRAWINGS

These and other features, objects, and advantages of the present invention will become apparent upon consideration of the following detailed description of the invention when read in conjunction with the drawing in which.

DESCRIPTION OF THE PREFERRED EMBODIMENTS

Figure 1:
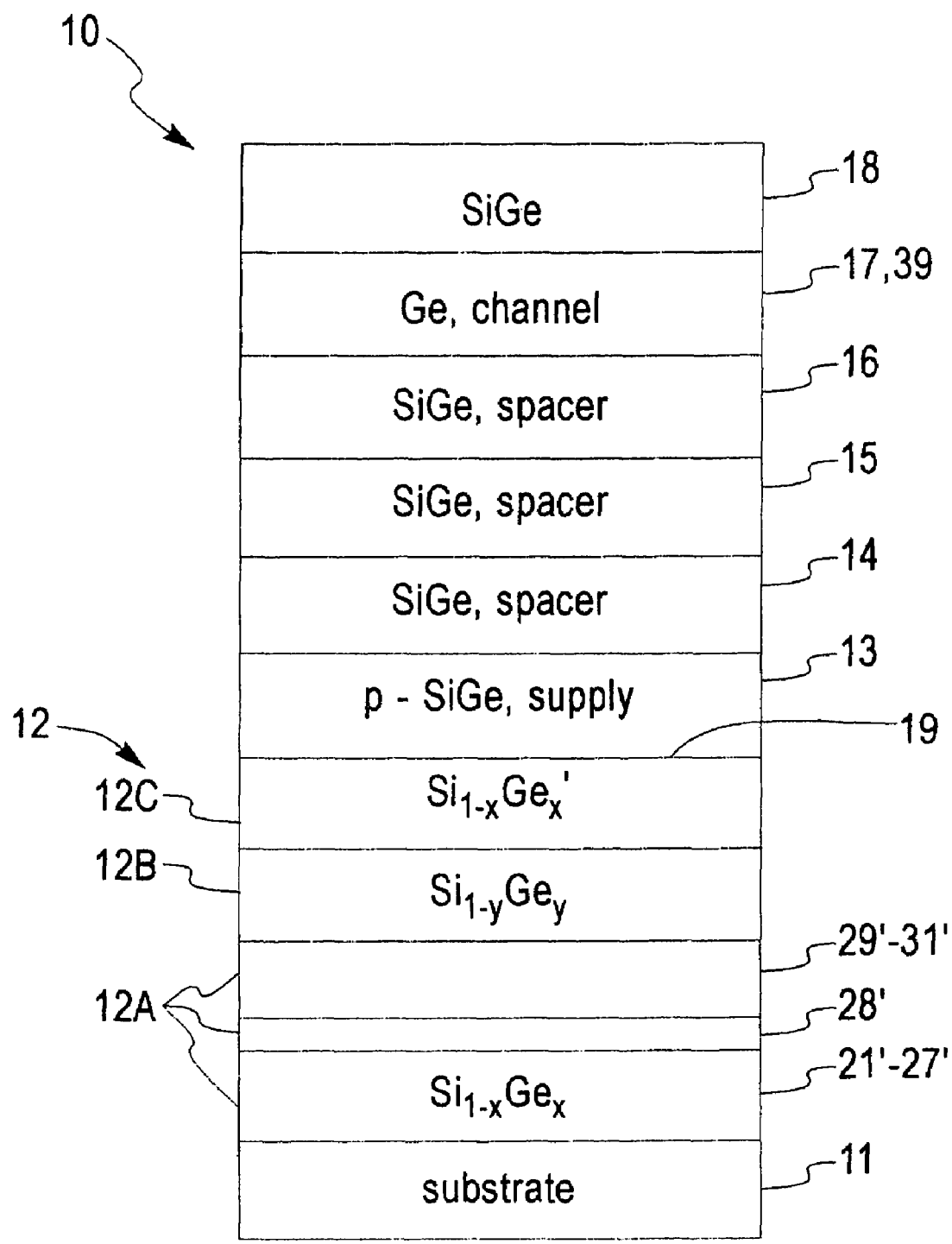
FIG. 1 is a cross section view of a layered structure illustrating one embodiment of the invention.

Referring to the drawing, and in particular to FIG. 1, a cross section view of a layered structure 10 for a Ge p-channel modulation-doped SiGe heterostructure is shown to illustrate the embodiment of the invention. Layers 12-18 are epitaxially grown on a single crystal semiconductor substrate 11 which may be Si, SiGe, Ge, SiC, GaAs, silicon-on-sapphire (SOS), silicon-on-insulator (SOI), Bond and Etch back Silicon On Insulator (BESOI), etc. using an epitaxial growth technique such as ultra high vacuum chemical vapor deposition (UHV-CVD), molecular beam epitaxy (MBE), or rapid thermal chemical vapor deposition (RTCVD). For a description of UHV-CVD methods for growing epitaxial Si and $Si_{1-x}Ge_x$ films on a silicon substrate, reference is made to U.S. Pat. No. 5,298,452 by B. S. Meyerson which issued Mar. 29, 1994 entitled "Method and Apparatus for Low Temperature, Low Pressure Chemical Vapor Deposition of Epitaxial Silicon Layers" which is incorporated herein by reference.

Figure 2:
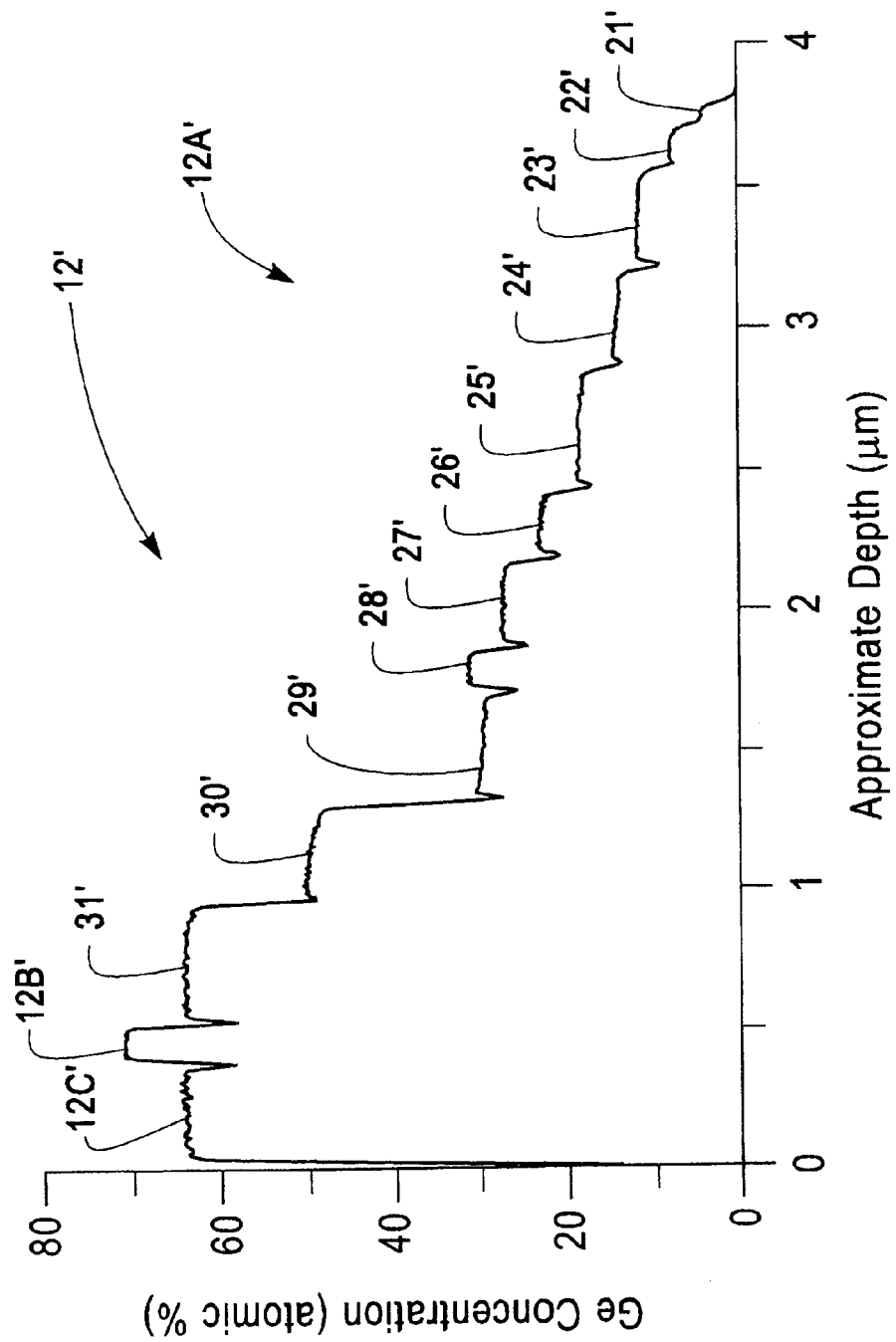
FIG. 2 is a SIMS graph showing the Ge concentration versus depth for the fabricated sample structure shown in FIG. 1 illustrating the preferred Ge compositional layered structure of the embodiment of the invention.

An illustration of a preferred layered structure 12' for the lower portion of layered structure 10 of layers 12C', 12B' and 12A' is shown in FIG. 2. FIG. 2 shows the corresponding Ge compositional profile of the SiGe layered structure 10 of layers 12C, 12B and 12A of FIG. 1 as measured by secondary ion mass spectroscopy (SIMS). In FIG. 2, the ordinate represents Ge concentration in atomic percent and the abscissa represents approximate depth in microns. In FIG. 2, curve portions 12A' including curve portions 21'-31', 12B' and 12C' correspond to the Ge concentration in layers 12A, 12B and 12C shown in FIG. 1.

Figure 2A:
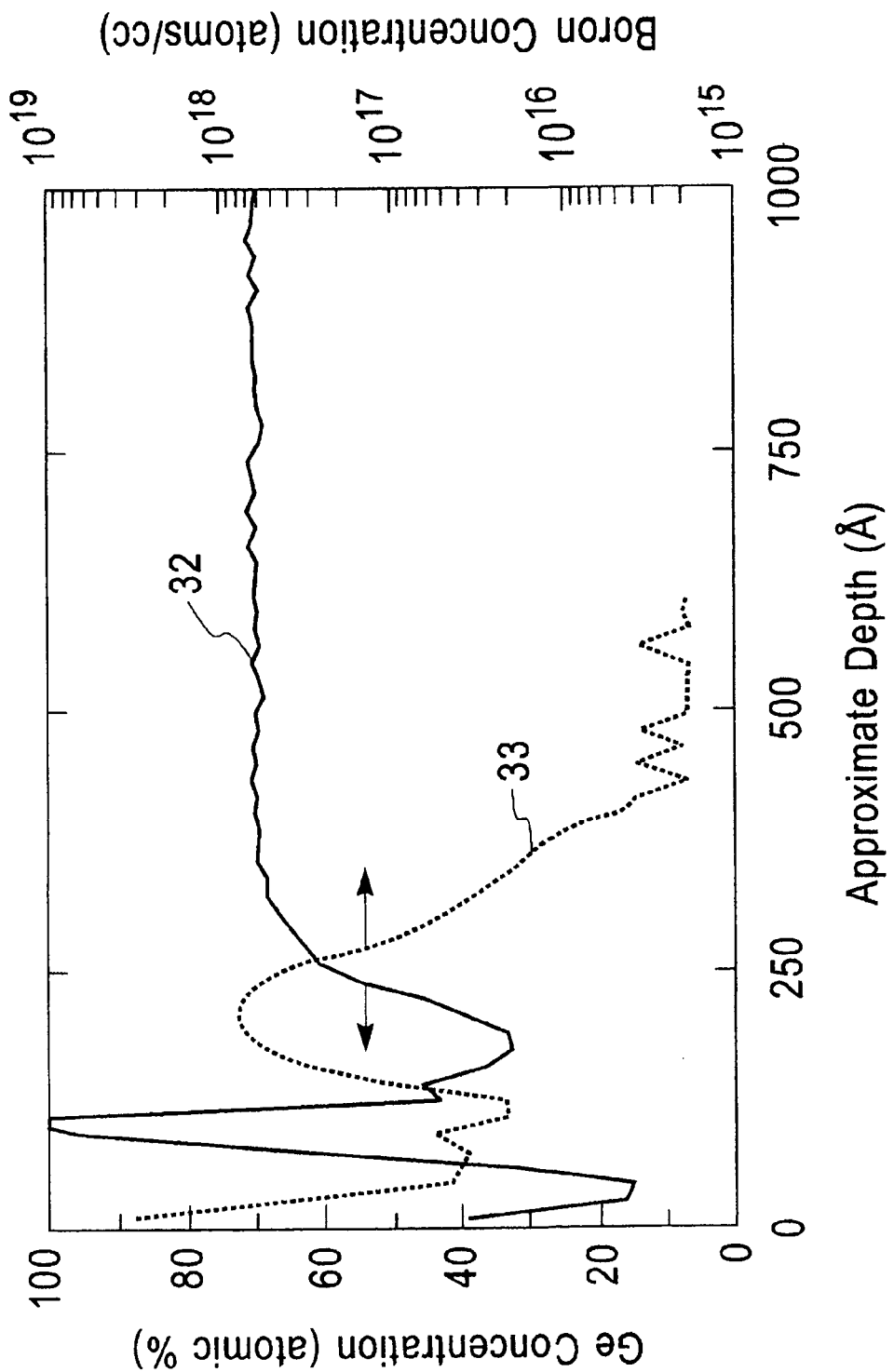
FIG. 2A is an expanded SIMS view of the upper portion of FIG. 2 to a depth of about 1000 Å showing the B and Ge concentration for the modulation-doped device region.

FIG. 2A is an expanded view of just the top part of FIG. 2 showing the device region only. In FIG. 2A, the ordinate on the left side represents Ge concentration in atomic percent and the abscissa represents approximate depth in angstroms. Curve 32 shows the Ge concentration as a function of approximate depth. In FIG. 2A the ordinate on the right side represents boron concentration in atoms/cc and curve 33 shows the boron concentration as a function of approximate depth.

The first epitaxial layer, described as layer 12A in FIGS. 1 and 2, of a relaxed $Si_{1-x}Ge_x$ alloy formed on the upper surface of substrate 11 comprised of a step-graded Ge compositional layer structure comprising layers 21-31. Layers 21-31 have a preferred profile shown in FIG. 2 where the strain has been relieved in the buffer layers 21-31 or below in substrate 11 via a modified Frank Read source as a mechanism to generate new dislocations. The Ge alloy doping profile to obtain relaxation via modified Frank Read sources is and described in U.S. Pat. No. 5,659,187 which issued on Aug. 19, 1997 to F. K. Legoues and B. S. Meyerson, and is incorporated herein by reference.

Buffer layer 12 comprises layers 12A, 12B and 12C and may be initially undoped, relaxed, and have a Ge composition at interface 19 between layers 12 and 13 in the range from about 50% to about 80% with a preferred value of about 65%.

The design of layer 12 is actually made of a starting $Si_{1-x}Ge_x$ layer 12A of a graded Ge composition formed over a Si substrate 11 follow by an overshoot layer of $Si_{1-y}Ge_y$ layer 12B where y=x+z and z is in the range of 0.01 to 0.1 with a preferred value of 0.05 formed over layer 12A, and finally by a more relaxed $Si_{1-x}Ge_x$ layer 12C, formed over layer 12B. Overshoot layer 12B has an overshoot of Ge concentration to provide additional stress in the layer to induce relaxation of the lattice spacing. Basically, the overshoot layer 12B functions to ensure a high degree of relaxation, i.e. >90% for the top $Si_{1-x}Ge_x$ surface layer 12C at interface 19. In the preferred case of achieving a fully relaxed $Si_{1-x}Ge_x$ layer 12C, it is desirable to use an overshoot layer 12B of $Si_{0.30}Ge_{0.70}$ as shown in FIG. 2 by curve portion 12B' with respect to curve portions 21'-31'. In relaxed $Si_{1-x}Ge_x$ layer 12C, the in-plane lattice parameter, $a_{SiGe}(x)$, is given by equation (1):

$$a_{SiGe}(x)=a_{Si}+(a_{Ge}-a_{Si})x \qquad (1)$$

where x is the Ge content and 1−x is the Si content and $a_{Si}$ and $a_{Ge}$ corresponds to the lattice constant for Si and Ge respectively, and consequently in the preferred case when the top $Si_{0.35}Ge_{0.65}$ surface layer is >90% relaxed, layer 12C would have a lattice constant which is greater than 5.02 Å.

In the case when $Si_{1-x}Ge_x$ layer 12C has a Ge composition value x which is greater than 0.50, a double "over shoot" layered structure is preferred whereby the first "over shoot" is a $Si_{1-m}Ge_m$ layer where m=0.5x, and the second "over shoot" is a $Si_{1-n}Ge_n$ layer where n=x+z and z is in the range from 0.01 to 0.1. Subsequently, in the preferred case of achieving a fully relaxed $Si_{0.35}Ge_{0.65}$ as mentioned above for layer 12C, it is desirable to use a first overshoot $Si_{1-m}Ge_m$ layer of $Si_{0.65}Ge_{0.35}$ as shown by curve portion 28' in FIG. 2 with respect to curve portions 21'-31', and a second overshoot $Si_{1-n}Ge_n$ layer of $Si_{0.30}Ge_{0.70}$ as shown by curve portion 12B' in FIG. 2 with respect to curve portions 21'-31'.

Structurally, layer 12 serves to relax the strain caused by the lattice mismatch between the top surface or interface 19 of relaxed layer 12C and the underlying Si substrate 11, 31 where there is a 4.2% lattice misfit as Ge has a lattice spacing of 1.04 times larger than the lattice spacing of single crystal Si. The buffer thickness of layer 12 can range from 2.5 to 6 mm but the preferred thickness is about 4.5 mm with a Ge compositional profile increasing from x=0 in a preferred step-wise fashion (compared to a continuous, linearly graded fashion) to a value in the range from x=0.10 to 1.0 with a preferred value of x=0.65 using a stepwise increase of 0.05Ge per incremental layer as shown in FIG. 2 by layers 21'-31' with two overshoot layers of 28' and 12B'.

The preferred method of growing silicon and silicon containing films, i.e. Si:B, Si:P, SiGe, SiGe:B, SiGe:P, SiGeC, SiGeC:B, SiGeC:P is the UHV-CVD process as described in U.S. Pat. No. 5,298,452 which issued Mar. 29, 1994 to B. S. Meyerson. A UHV-CVD reactor suitable for growing the above-mentioned silicon and silicon containing films is available from Balzers and Leybold Holding AG in Switzerland, Epigress in Sweden, and CVD Equipment Corp. in Ronkonkoma, N.Y., USA. For a description of additional UHV-CVD and low pressure (LP)-CVD methods for growing epitaxal Si, $Si_{1-x}Ge_x$ and dielectrics with improved interfaces, alloy profiles and dopant profiles, reference is made to U.S. Pat. No. 6,013,134 by J. O. Chu et al. which issued Jan. 11, 2000 entitled "Advanced Integrated Chemical Vacuum Deposition (AICVD) For Semiconductor" which is assigned to the assignee herein and which is incorporated herein by reference.

In layered structure 10 for a Ge p-channel modulation-doped SiGe heterostructure, a p-doped strained or relaxed SiGe layer 13 as shown in FIG. 1 is first formed over layer 12C to function as the donor or supply layer beneath an active channel. Layer 13 may have a thickness in the range from 1 to 20 nm and should have an electrically active donor dose in the range from 1 to $5\times10^{12}$ cm$^{-2}$. The p-doped layer 13 may be either strained or relaxed having a Ge composition in the range from 20% to <70% with a preferred composition in the range of 30% to 40% and a preferred thickness in the range from 2 to 4 nm. The p-type dopant of layer 13 may be incorporated in SiGe layer 13 by doping with different flows of $B_2H_6$ during epitaxial growth of layer 13. An example of a preferred boron dopant profile for SiGe layer 13 is shown in FIG. 2A by curve portion 33 with an integrated dose of about $2.0\times10^{12}$ boron/$cm^2$. For forming abrupt doped layers such as layer 13 with respect to adjacent layers, reference is made to Ser. No. 08/885,611 filed Jun. 30, 1997 by F. Cardone et al. entitled "Abrupt 'Delta-Like' Doping In Si and SiGe Films by UHV-CVD" which is incorporated herein by reference. An undoped SiGe layer 14 (except unwanted background doping from the CVD or other growth system) which may be strained or relaxed is epitaxially formed above p-doped layer 13 as a spacer layer. Layer 14 functions to separate the dopants in layer 13 from the active channel layer 17 to be formed above. The thickness of layer 14 should remain below the critical thickness of a SiGe layer with respect to the lattice spacing at interface 19 of relaxed layer 12. The preferred thickness of layer 14 is in the range from 2 to 4 nm with a Ge composition in the range from 25% to 30% in the case when layer 12 at interface 19 is a relaxed $Si_{0.35}Ge_{0.65}$ layer. A second undoped SiGe layer 15 (except unwanted background doping from the CVD system) is epitaxially formed above layer 14 and similar to layer 13 functions as a spacer layer to further separate the dopants in layer 13 from the above Ge channel layer 17. Likewise, the thickness of layer 15 should remain below the critical thickness of a SiGe layer with respect to the lattice spacing at interface 19 of relaxed layer 12, and the preferred thickness is in the range from 1 to 3 nm with a preferred Ge composition in the range from 20% to 25% in the case when layer 12 is a relaxed $Si_{0.35}Ge_{0.65}$ layer.

Next, a third undoped SiGe layer 16 (except unwanted background doping from the CVD system) is epitaxially grown over layer 15 and similar to layers 14-15, functions as a spacer layer to further separate the dopants in layer 13 from the above Ge channel 17 in order to maintain a high hole mobility in layer 17. Again similar to layers 14-15, the thickness of layer 16 should remain below the critical thickness of a SiGe layer with respect to the lattice spacing at interface 19 of relaxed layer 12. The preferred thickness of layer 16 is in the range from 1 to 4 nm with a preferred Ge composition in the range from 40% to 50% in the case when layer 12 is a relaxed $Si_{0.35}Ge_{0.65}$ layer. In order to achieve device performance with high transconductances at room temperature, it is preferable to minimize the layer thicknesses of spacer layers 14-16.

A compressively-strained Ge layer 17 is epitaxially grown above layer 16 which functions as the active high mobility p-channel 33 for p-channel field effect transistors. For a detailed description of a UHV-CVD method for growing an epitaxial Ge film on a silicon substrate, reference is made to U.S. Pat. No. 5,259,918 by S. Akbar, J. O. Chu, and B. Cunningham which issued Nov. 9, 1993 entitled "Heteroepitaxial Growth of Germanium on Silicon by UHV/CVD" which is incorporated herein by reference In order for layer 17 to be an effective high mobility p-channel 39, the epitaxial Ge must be of device quality layer void of structural defects, e.g. stacking faults and any interface roughness problems between layers 16 and 17. For example, in the preferred case when layer 12C is a relaxed $Si_{0.35}Ge_{0.65}$ layer at interface 19, the thickness of Ge layer 17 may be in the range from 2 to 250 Angstroms with a preferred thickness in the range of 140 to 150 Angstroms as shown in FIG. 4.

Figure 3:
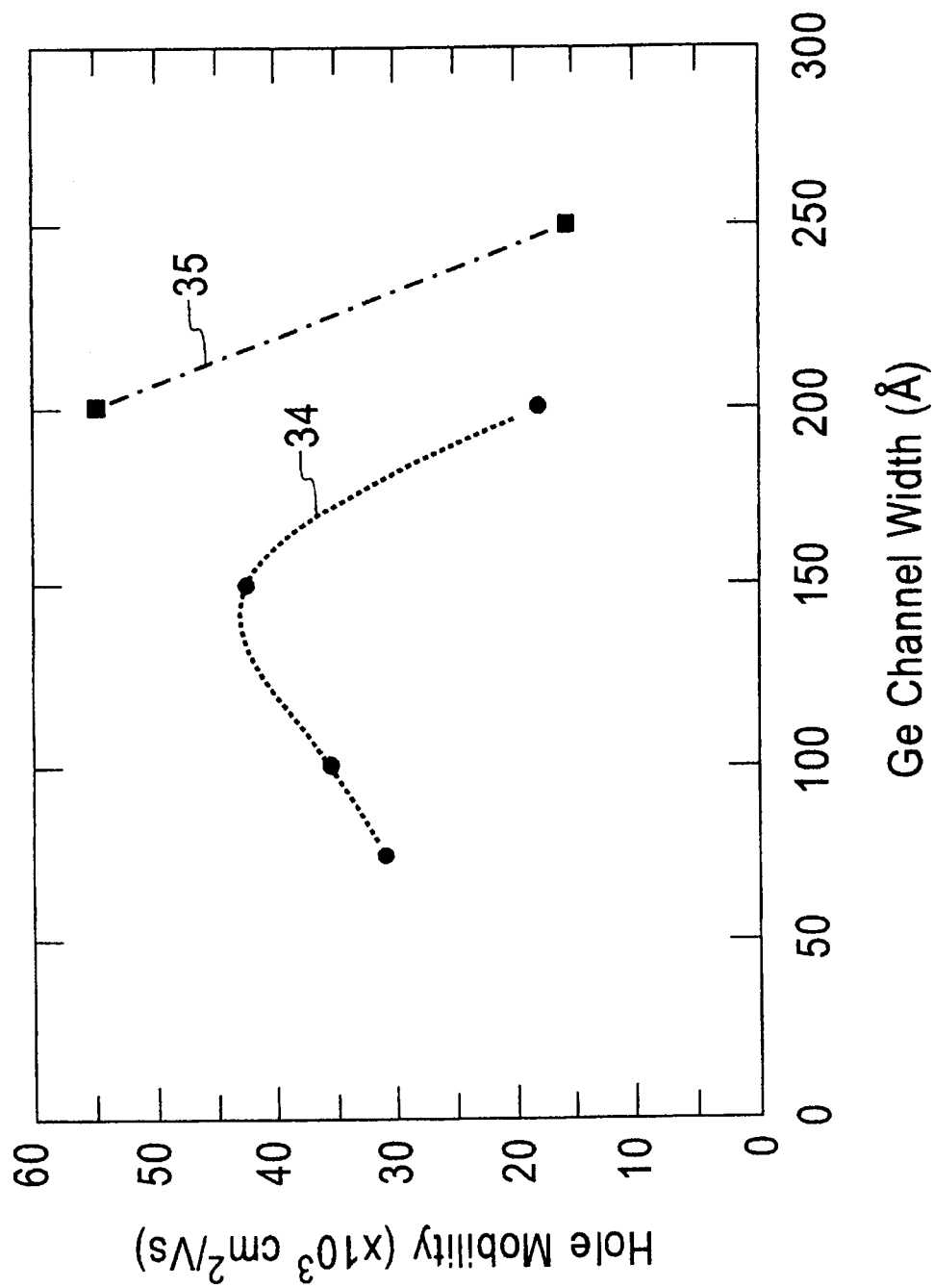
FIG. 3 shows data points plotted in a graph showing the hole mobility versus Ge channel width or thickness.

It should be noted that the preferred embodiment for the Ge channel thickness in the case when layer 12C is a relaxed $Si_{0.35}Ge_{0.65}$ layer does agree with published results where the data is replotted in FIG. 3. The published data was from a publication by Y. H. Xie, D. Monroe, E. A. Fitzgerald, P. J. Silverman, F. A. Thiel, and G. P. Watson entitled "Very high mobility two-dimensional hole gas in Si/$Ge_xSi_{1-x}$/Ge structures grown by molecular beam epitaxy", Appl. Phys. Lett. 63 (16), 18 Oct. 1993, pp 2263-2264 which is incorporated herein by reference. In FIG. 3, the ordinate represents hole mobility $m_h$ in $cm^2$/Vs and the abscissa represents Ge channel width or thickness in angstroms. The relationship between the measured mobility of the two-dimensional hole gas (2DHG) at 4.2K and the Ge channel thickness in a modulation-doped heterostructure (grown by MBE) is shown in FIG. 3 where curve portion 34 represents a Ge channel layer being fabricated on a fully relaxed $Si_{0.40}Ge_{0.60}$ buffer while curve portion 35 corresponds to a Ge channel layer which is fabricated on a relaxed $Si_{0.30}Ge_{0.70}$ buffer layer grown on a Si substrate. The peak portion of curve 34 in FIG. 3 showing the highest hole mobility for a Ge channel fabricated on a $Si_{0.40}Ge_{0.60}$ buffer does correspond to an optimum Ge channel width in the range from 140 to 150 angstroms which is in excellent agreement with the preferred embodiment described above. Since the preferred buffer layer 12 is a relaxed $Si_{0.65}Ge_{0.35}$ layer as oppose to the $Si_{0.40}Ge_{0.60}$ layer of curve 34, the actual optimum Ge channel width or thickness would be greater than 150 angstroms and may be in the range from 150 to 200 angstroms.

Figure 4:
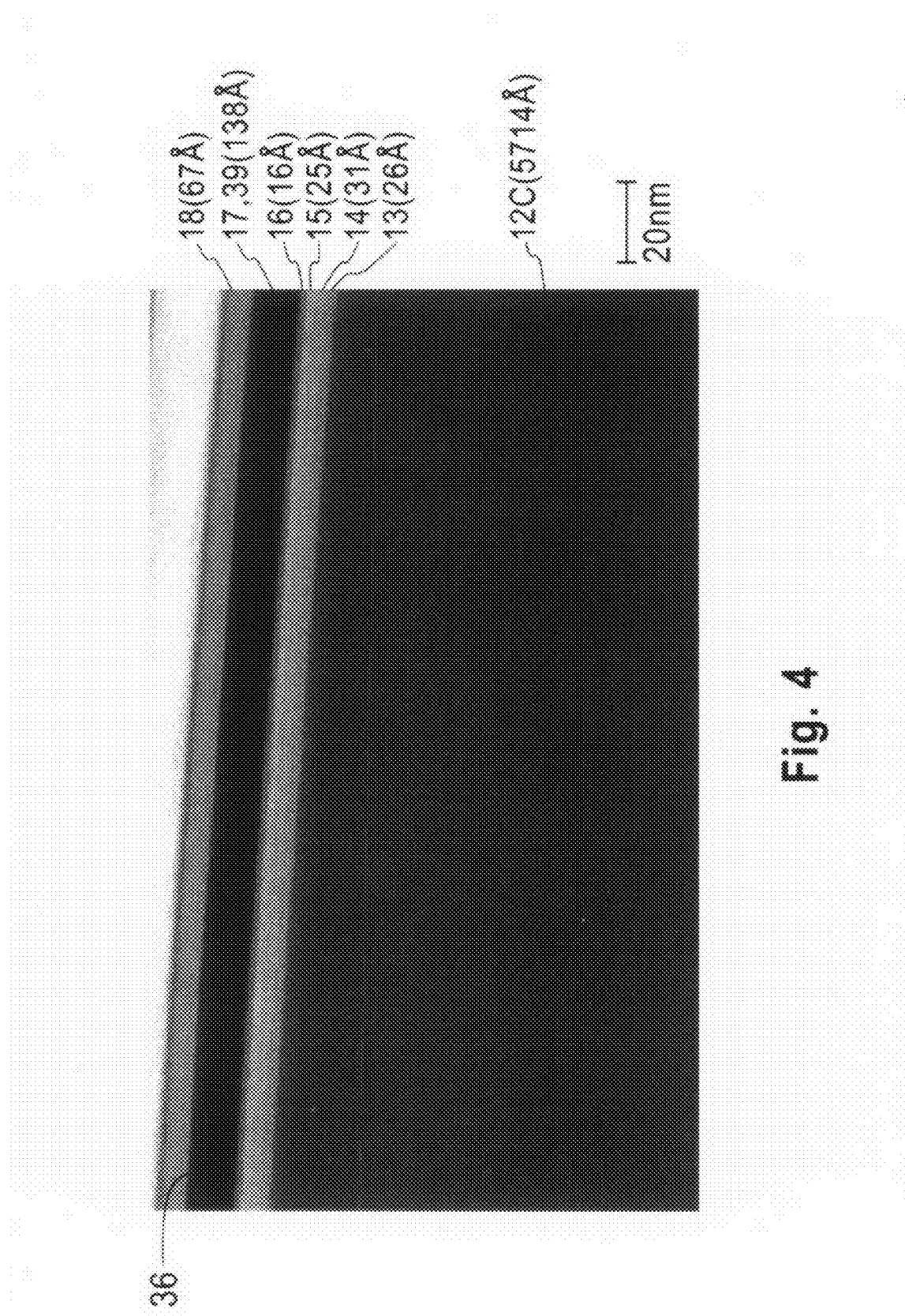
FIG. 4 is a detailed cross-sectional TEM of the upper device region of the fabricated sample structure shown in FIG. 2 illustrating the Ge p-channel modulation-doped device structure of the embodiment of the invention.

FIG. 4 shows a high mobility Ge channel layer 17 in a preferred embodiment describe above having stacking faults typically less than $10^4$ defects/$cm^2$ and may be in the range from $10^3$ to $10^6$ defects/$cm^2$. In FIG. 4, the smoothness of the upper surface of layer 17 at interface 36 is shown. Stacking faults are reduced to below $10^6$ defects/$cm^2$ by the 90% relaxation of layer 12 at interface 19. A stacking fault is a planar defect in a crystal lattice stemming from a disordering in the normal stacking sequence of atom planes in the crystal lattice due to either the insertion of an extra layer of atoms or the removal of a partial atomic layer. The percent of relaxation of a layer can be determined by measuring the lattice constant such as by X-ray diffraction (XRD) techniques.

Above layer 17, a SiGe cap layer 18 is grown having the preferred Ge composition in the range from 20 to 50% and functions to separate p-channel 39 from the surface and to confine the hole carriers in layer 17. The thickness for layer 17 may range from 2 to 25 nm, with the preferred thickness in the range from 10 to 15 nm. Layers 13, 14, 15, 16, and 18 may have the same composition of silicon and germanium to provide the same lattice spacing where the Ge content may be in the range from 20 to 70% with a preferred range from 20 to 50% in the case when layer 12C at interface 19 has a lattice spacing equivalent to a relaxed $Si_{0.35}Ge_{0.65}$ buffer layer.

The channel confinement of holes and its enhanced transport mobility is a result of the higher compressive strain in the composite channel structure having a high Ge content layer with respect to the relaxed buffer layer of layer 12 at interface 19 arising from the 4.2% larger lattice constant for pure Ge relative to Si. The structural ability to create and enhance the compressive strain in the Ge channel layer formed on the relaxed SiGe buffer of layer 12 can significantly alter the conduction and valence bands of the p-channel layer of 17. Moreover, an important parameter for the design of the p-channel modulation-doped heterostructure is the valence-band offset ($DE_v$) of the compressively strained Ge channel layer relative to the relaxed $Si_{1-x}Ge_x$ epilayer of layer 12, and is given by the expression:

$$DE_v = (0.74 - 0.53x') \times (eV)$$

where x' is the Ge content of the relaxed SiGe epilayer of layer 12 and x is the Ge content in the hole channel. This formulation is reported in a publication by R. People and J. C. Bean entitled "Band alignments of coherently strained $Ge_xSi_{1-x}$/Si heterostructures on <001> $Ge_ySi_{1-y}$ substrates", Appl. Phys. Lett. 48 (8), 24 Feb. 1986, pp 538-540 which is incorporated herein by reference. More specifically, the valence band discontinuity ($DE_v$) for layer 17 of a pure Ge channel formed over a relaxed $Si_{0.35}Ge_{0.65}$ of layer 12 would be 396 meV which is an effective quantum well or potential barrier for hole confinement. Importantly, the compressive strain in the SiGe or Ge layer also serves to split the valence band into the heavy hole and light-hole bands whereby the hole transport in the upper valence band with the lighter hole mass for carrier transport along the strained channel will result in enhanced hole mobilities that could be significantly higher as described below than found in Si p-channel field effect transistors which typically have a mobility of about 75 $cm^2/Vs$ as reported in a publication by M. Rodder et at. entitled "A 1.2V, 0.1 mm Gate Length CMOS Technology: Design and Process Issues", IEDM 98-623. Consequently, the measured hole mobilities in the occupied hole band for the high mobility Ge channel 39 structure shown in FIG. 1 are in the range from 1,500 to greater than 2,000 $cm^2/Vs$ at 300K and in the range from 30,000 to greater than 50,000 $cm^2/Vs$ at 20K for the case when layer 17 is a Ge channel with a thickness in the range from 10 to 15 nm.

Figure 5:
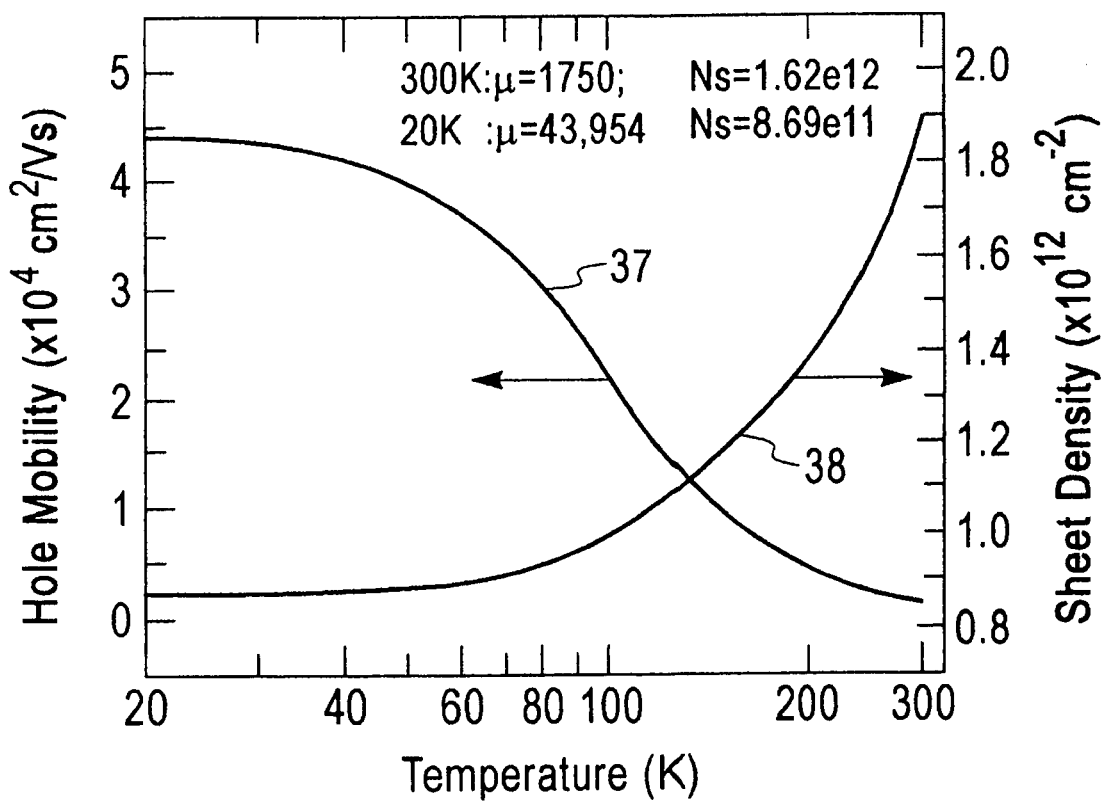
FIG. 5 is a graph of the measured hole mobility versus temperature in Kelvin (K) from Hall measurements and associated sheet densities.

Furthermore in FIG. 5, curve 37, shows the measured two-dimensional hole gases (2DHG) hole mobility behavior as a function of temperature for a Ge p-channel 39 with a thickness of 138 angstroms as shown in FIG. 4 when it is properly grown on a relaxed $Si_{0.35}Ge_{0.65}$ buffer layer 12. It is noted that when the Ge p-channel layer is grown on a lower content buffer from layer 12 of $Si_{0.35}Ge_{0.65}$ or on an unsuitable SiGe buffer layer, a degraded mobility behavior will be observed which would be associated with a poor quality or defective Ge channel structure showing the sensitivity of the Ge p-channel 39 to the proper design of layer 12 such as the composition profile, extent of relaxation, and remaining stacking faults and misfit dislocations. In FIG. 5, the ordinate on the left side represents hole mobility $m_h$ in $cm^2/Vs$ and the abscissa represents temperature in degrees K. The measured mobilities as shown by curve 37 for a Ge p-channel 39 are a factor of 9 to 10 higher than that found in Si p-channel field effect transistors. The measured mobilities as shown by curve 37 for Ge p-channel 33 had a defect density similar to that shown in FIG. 4 and is typically in the range from $10^3$ to $10^6$ defects/$cm^2$. In FIG. 5, the ordinate on the right side represents sheet density in holes/$cm^2$ and curve 38 shows the corresponding carrier density for the measured mobilities of curve 37 as a function of temperature. At 300K, the mobility $m_h$ of Ge p-channel 39 equals 1,750 $cm^2/Vs$ at a sheet carrier density of $1.62 \times 10^{12}$ $cm^{-2}$. At 20K, the mobility $m_h$ of Ge p-channel 39 equals 43,954 $cm^2/Vs$ at a sheet carrier density of $8.69 \times 10^{11}$ $cm^{-2}$.

Figure 6:
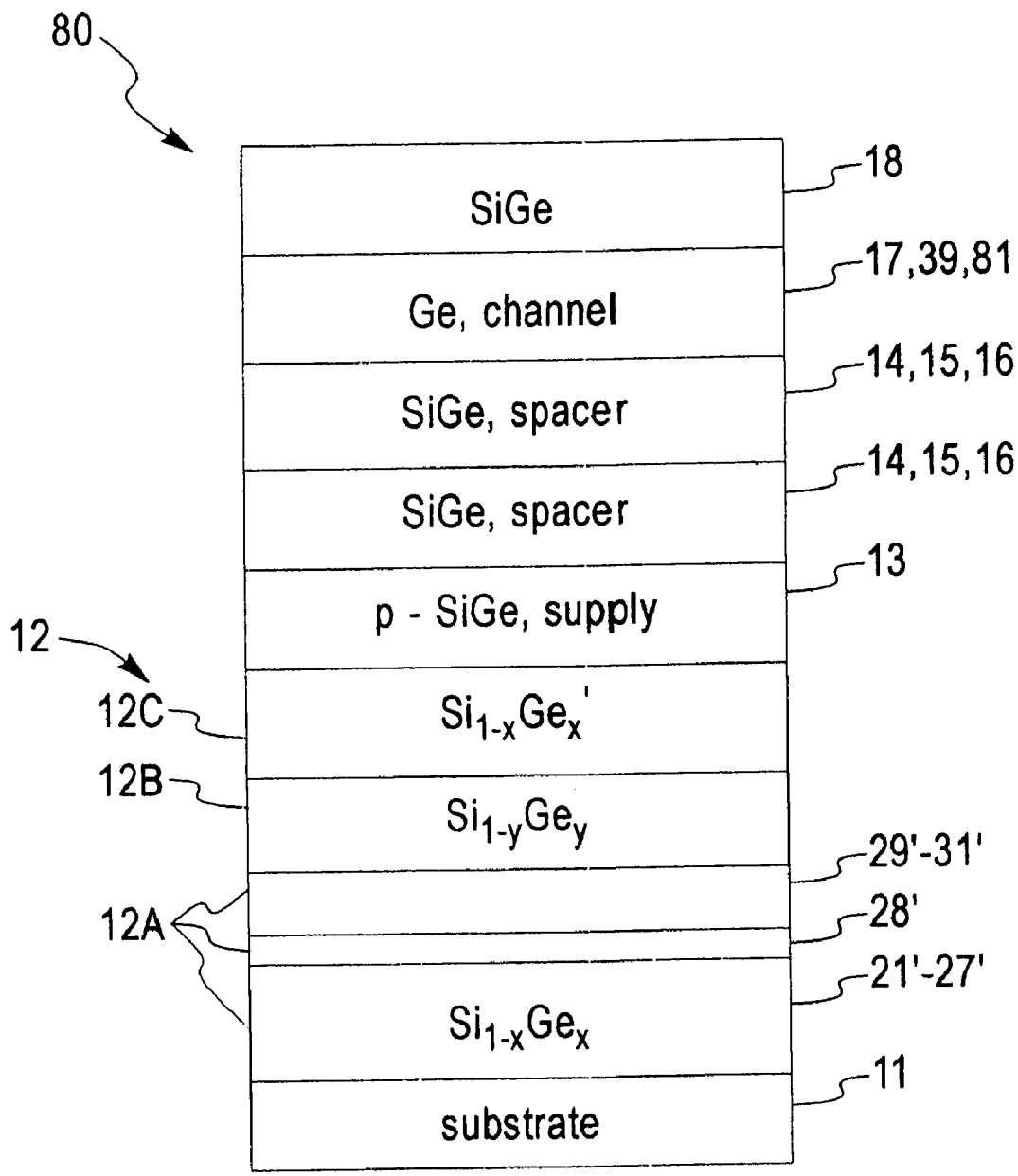
FIG. 6 is a cross section view of a layered structure illustrating a second embodiment of the invention.

In an alternate embodiment shown in FIG. 6, either one of three spacer layers 14,15,16 shown in FIG. 1, for example, SiGe spacer layer 14 or SiGe spacer layer 15 or SiGe spacer layer 16 may be structurally omitted from the the Ge p-channel 17 layered structure 10 without introducing any major degradation in the hole confinement and mobility of the carriers in p-channel 39. In FIG. 6, like references are used for functions corresponding to the apparatus of FIG. 1.

In the design of a modulation-doped device 10, 80 shown in FIGS. 1 and 6, a thicker spacer of spacer layers 16, 15 and 14 is usually more desirable and important when attempting to optimize the carrier mobility transport at low temperatures (i.e. less than <20 K) by further separation of the active carriers in p-channel 17 from ionized hole donors in the supply layer 13. Nevertheless, for room temperature transport, there is minimal observable effect (if any at all) when only one of the three spacer layers, for example SiGe spacer 14 or SiGe spacer layer 15 or SiGe spacer layer 16 is present to space Ge channel 81 of modulation-doped device 80 from supply layer 13. Likewise, there is minimal observable effect (if any at all) when only two of the three spacers, for example a dual spacer combination of either layers 14 and 15 or layers 14 and 16 or layers 15 and 16 is present to space Ge channel 81 of modulation-doped device 80 from layer 13.

Figure 7:
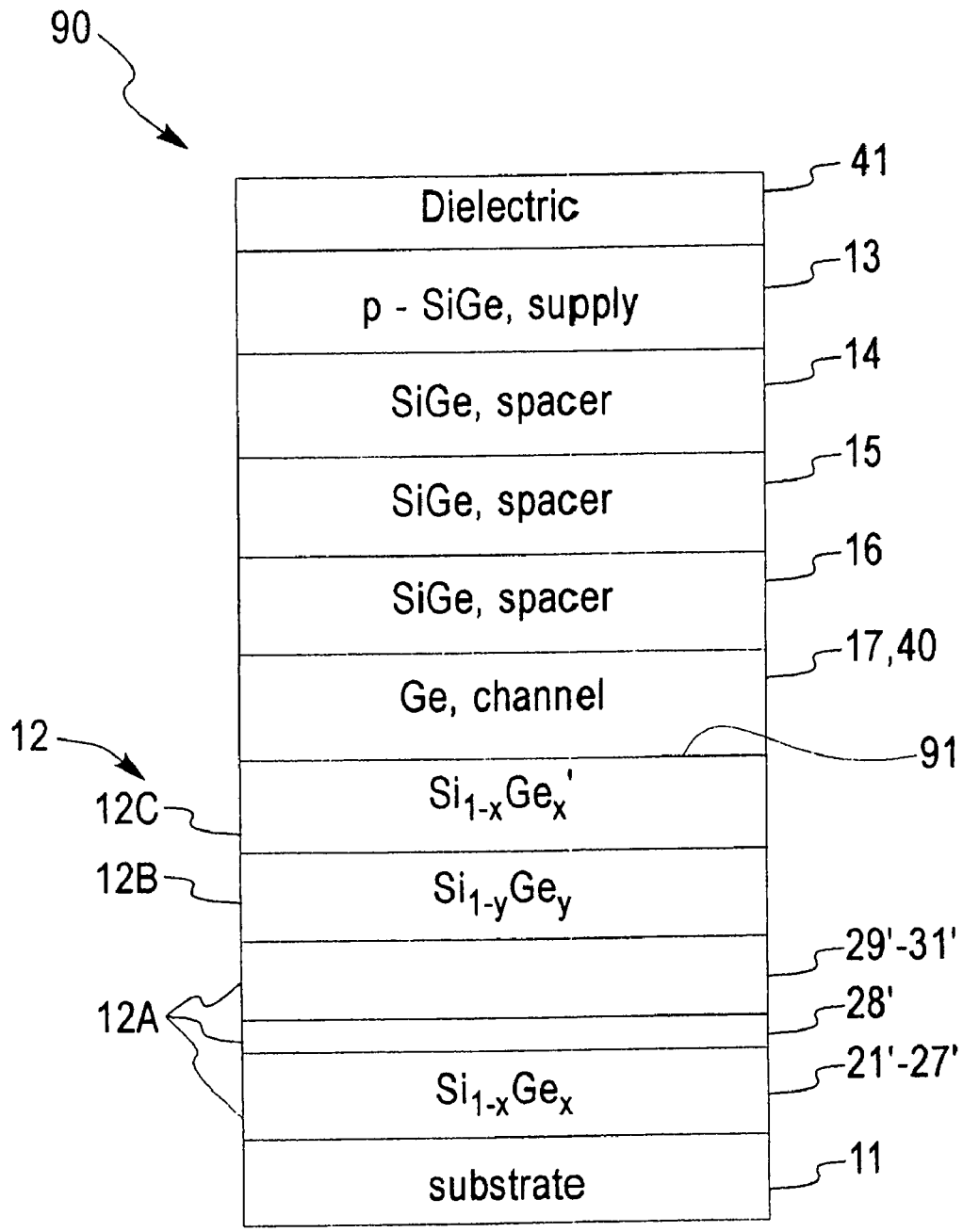
FIG. 7 is a cross section view of a layered structure illustrating a third embodiment of the invention.

In an alternate embodiment shown in FIG. 7, layered structure 90 has a channel 40 comprising a Ge layer 17 formed above buffer layer 12. SiGe layer 16 is formed above channel 40, SiGe layer 15 is formed above layer 16, SiGe layer 14 is formed above layer 15, and the supply layer, p-doped SiGe layer 13 is formed above SiGe layer 14. A dielectric layer 41, for example, silicon dioxide, silicon oxynitride, or aluminum oxide is formed over SiGe layer 13. In FIG. 7, like references are used for functions corresponding to the apparatus of FIG. 1.

In a layered structure 90 suitable for a modulation-doped device, supply layer 13 is situated above active channel 40 as shown in FIG. 7, the active p-channel 40 is comprised of a strained Ge layer 17 which is less than the critical thickness with respect top the lattice spacing at interface 91. Ge layer 17 is first formed on layer 12C to form interface 91. Layer 17 functions as the channel region 40 of a field effect transistor. Next, spacer layers comprised of SiGe spacer layer 14, SiGe spacer layer 15, and SiGe spacer layer 16 are grown over channel layer 17 which functions to separate the dopants in the above supply layer 13 from the below active channel layer 17, 40. Above spacer layer 14, a p-doped SiGe supply layer 13 is formed which functions as a donor layer or supply layer above active channel layer 17, 40. The germanium composition and thickness for layers 17, 16, 15, 14, and 13 may be the same or equivalent to those of like reference numbers in FIG. 1 which shows a Ge channel layered structure 10 with the SiGe supply layer 13 below channel 17, 81. In this layered structure design, the supply layer or the p-doped SiGe layer of layer 13 can be further separated above the active Ge channel of layer 17, 40 with the addition of a strained Si spacer layer between layers 16 and layer 15, or between layers 15 and layer 14, or between layers 14 and layer 13. The thickness for this additional strained Si spacer should remain below the critical thickness of a Si layer with respect to the lattice spacing at interface 91 of relaxed layer 12, and is preferred to be added between layers 14 and 13.

Figure 8:
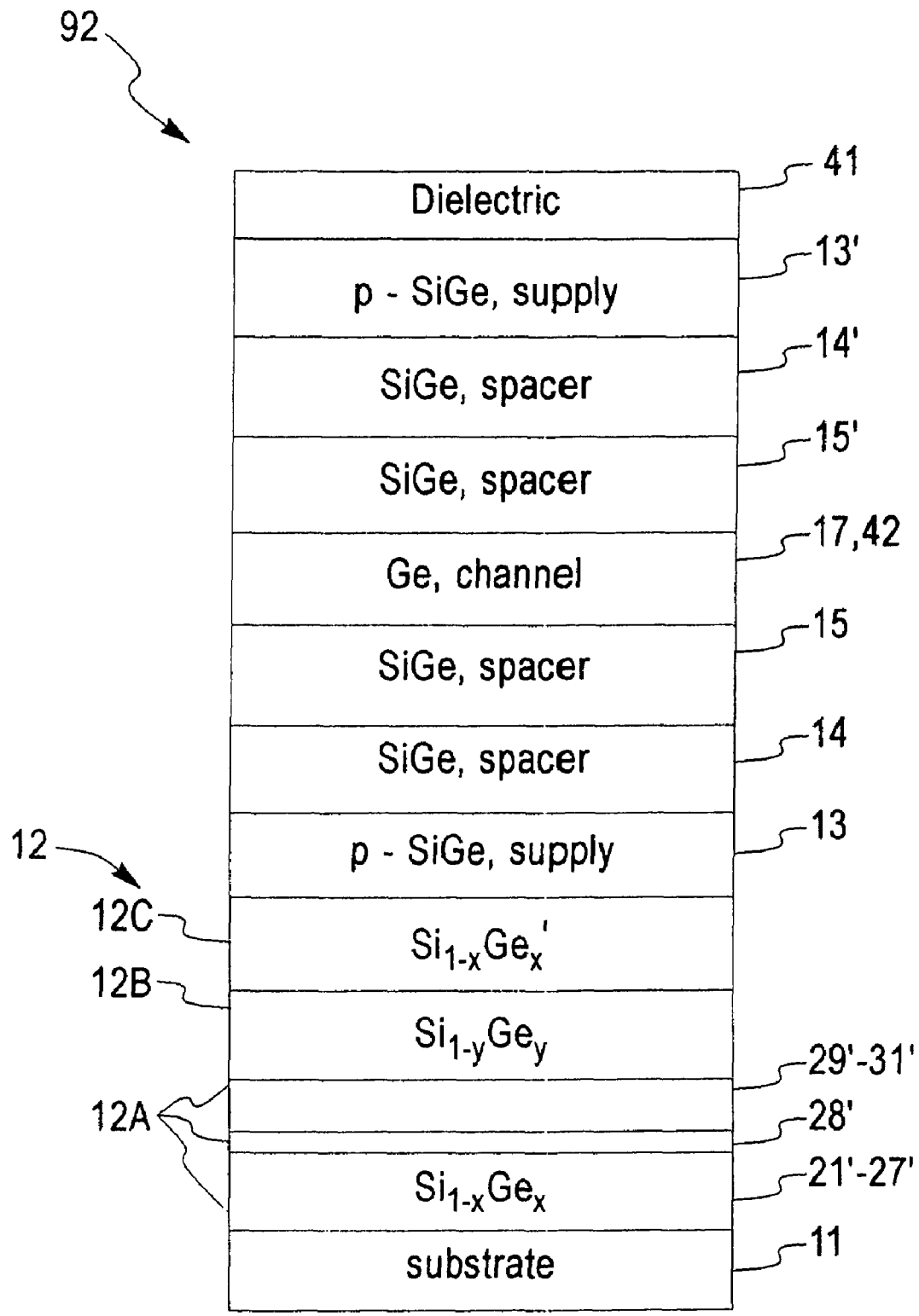
FIG. 8 is a cross section view of a layered structure illustrating a fourth embodiment of the invention.

In an alternate embodiment shown in FIG. 8, layered structure 92 has a supply layer comprising a p-doped SiGe layer 13 formed above buffer layer 12. SiGe layer 14 is formed above supply layer 13, SiGe layer 15 is formed above layer 14, channel 42 comprising a Ge layer 17 is formed above layer 15, SiGe layer 15' is formed above channel 42, SiGe layer 14' is formed above layer 15', and the supply layer, p-doped SiGe layer 13' is formed above SiGe layer 14'. A dielectric layer 41, for example, silicon dioxide, silicon oxynitride, silicon nitride, tantalum oxide, barium strontium titanate or aluminum oxide is formed over SiGe layer 13'. In FIG. 8, like references are used for functions corresponding to the apparatus of FIG. 1.

Figure 9:
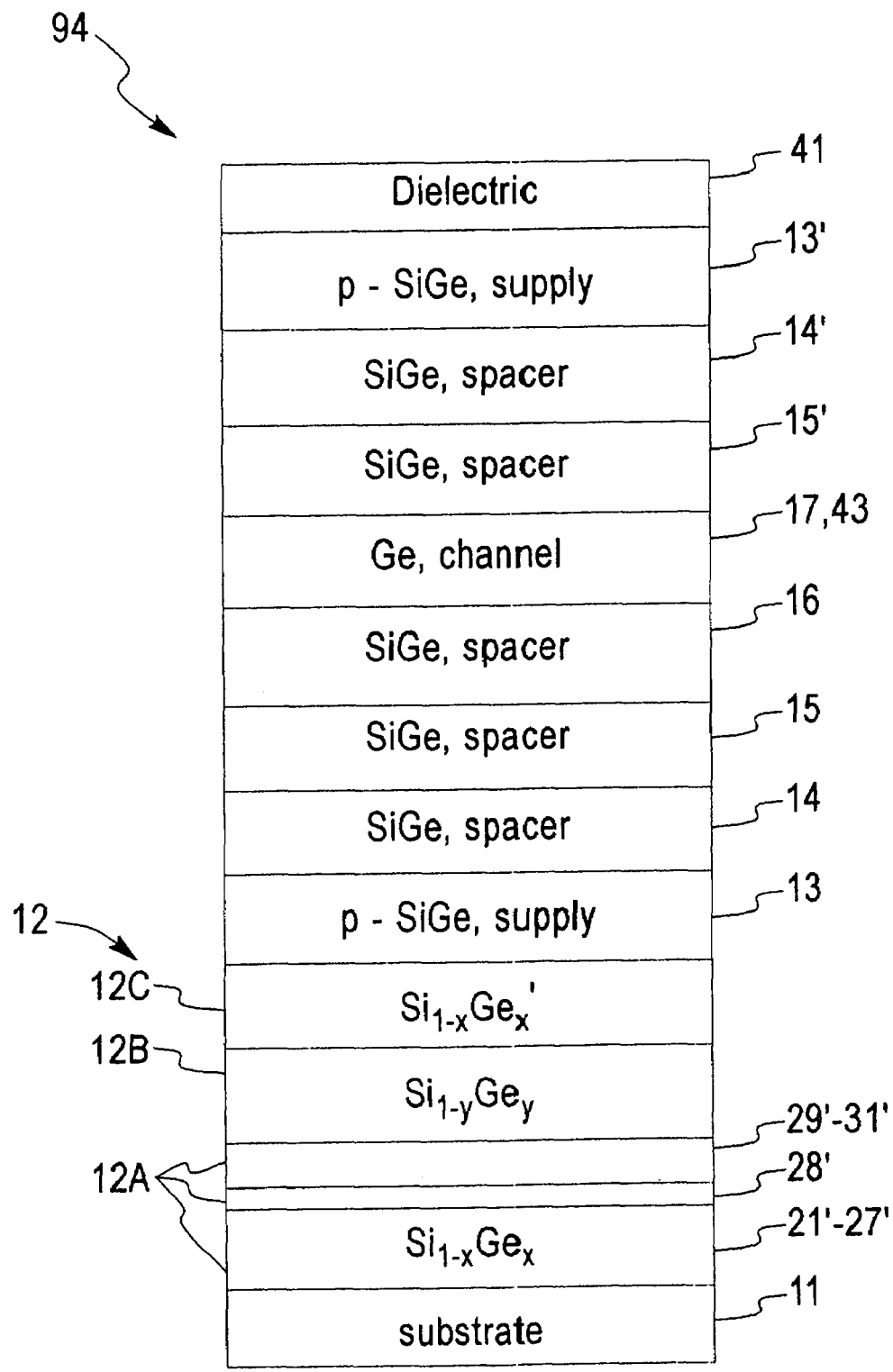
FIG. 9 is a cross section view of a layered structure illustrating a fifth embodiment of the invention.

In an alternate embodiment shown in FIG. 9, layered structure 94 has a supply layer comprising a p-doped SiGe layer 13 formed above buffer layer 12. SiGe layer 14 is formed above supply layer 13, SiGe layer 15 is formed above layer 14, SiGe layer 16 is formed above layer 15, channel 43 comprising a Ge layer 17 is formed above layer 16, SiGe layer 15' is formed above channel 43, SiGe layer 14' is formed above layer 15', and the supply layer, p-doped SiGe layer 13' is formed above SiGe layer 14'. A dielectric layer 41, for example, silicon dioxide, silicon oxynitride, silicon nitride, tantalum oxide, barium strontium titanate or aluminum oxide is formed over SiGe layer 13'. In FIG. 9, like references are used for functions corresponding to the apparatus of FIG. 1.

Figure 10:
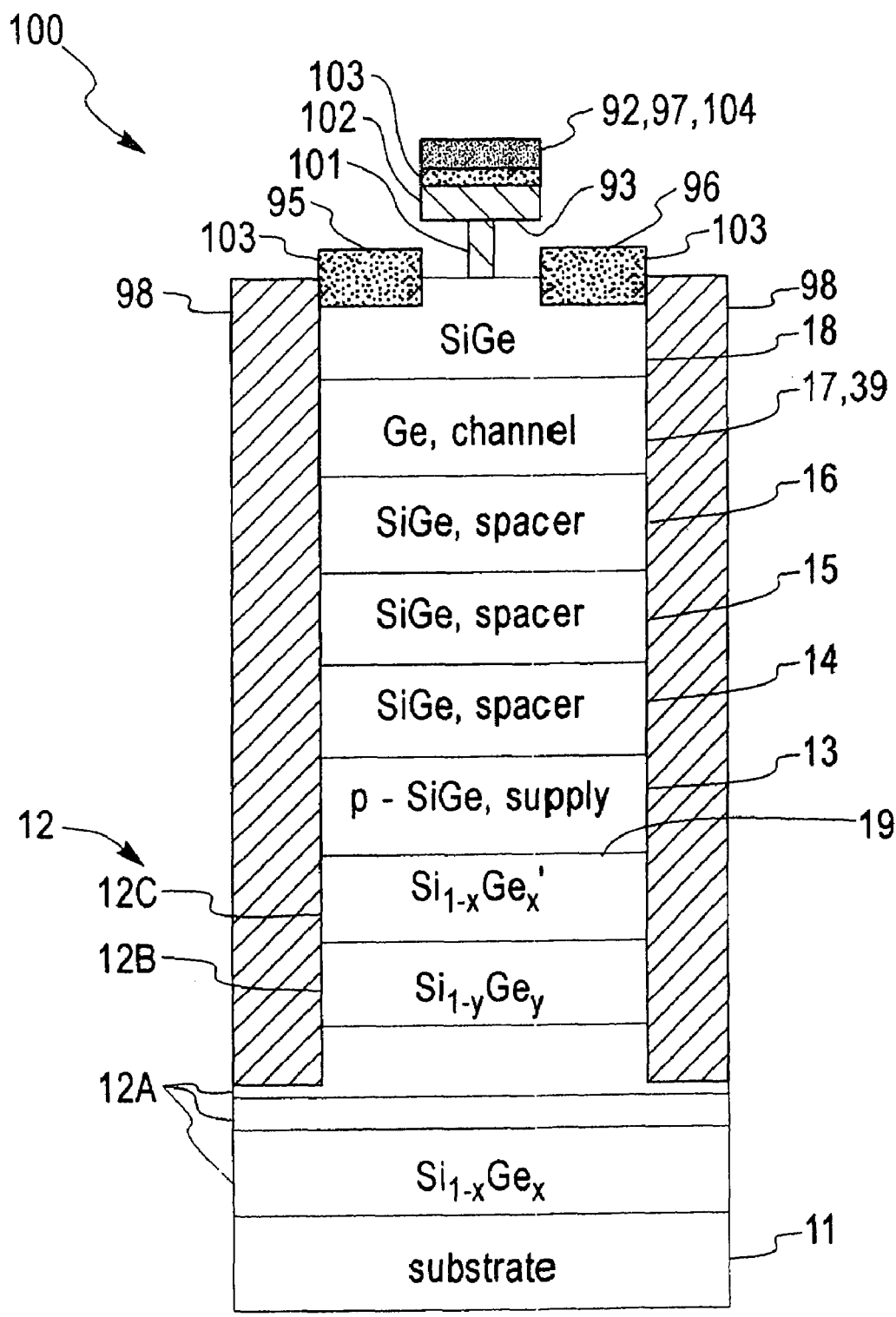
FIG. 10 is a cross section view of a high mobility p-MODFET incorporating the layered structure of FIG. 1.

A cross section view of a self-aligned high mobility p-MODFET device 100 is shown in FIG. 10. Self-aligned high mobility p-MODFET device 90 incorporates the layered structure of FIG. 1. A self-aligned MODFET process is preferred to be used to minimize the access resistance associated with a Schottky gated device structure, and the process usually requires patterning and evaporation of the gate metalization prior to the source/drain ohmic metalization. Typically, a T-shaped gate 92 is fabricated such that the gate overhang 93 serves as a mask for the source and drain ohmic contact evaporation which prevents shorting of the source drain ohmic contacts 95 and 96 to Schottky gate 92. A Pt ohmic contact process having a low contact resistance to SiGe layers has been reported in a publication by M. Arafa, K. Ismail, J. O. Chu, M. S. Meyerson, and I. Adesida entitled "A 70-GHz $f_T$ Low Operating Bias Self-Aligned p-Type SiGe MOD-FET", IEEE Elec. Dev. Lett, vol 17(12), December 1996, pp 586-588 which is incorporated herein by reference.

The fabrication scheme for p-MODFET device 100 starts with defining the active areas via mesa isolation etching followed by evaporating or depositing of $SiO_x$ to form the field regions 98 around the active device area. The gate structure and its patterning can be performed in a PMMA/P(MMA-MMA)/PMMA trilayer resist using electron-beam lithography followed by the evaporation and lift-off to form the T-shaped gate structure comprised of a Ti/Mo/Pt/Au metallization stack 97. A layer 101 of Ti is formed on SiGe layer 18. A layer 102 of Mo is formed over the Ti. A layer 103 of Pt is formed over layer 102 and a layer 104 of Au is formed over layer 103. Source and drain ohmic contacts 95 and 96 can be formed by evaporating Pt over T-shaped gate stack 97 followed by lift-off using an image-reversed mesa patterning process. Small gate dimensions using this fabrication scheme having a gate footprint down to 0.1-mm has been demonstrated along with a self-aligned source/drain-to-gate distance as determined by the overhang 93 of ~0.1 mm. Self-aligned devices with a gate length of 0.1 mm have been fabricated on high mobility strained Ge channel structures having a hole mobility of 1750 $cm^2/Vs$ (30,900 $cm^2/Vs$) at room temperature (T=77 K) and these devices exhibited room-temperature peak extrinsic transconductances as high as 317 mS/mm, at a low bias voltage of $V_{ds}$=−0.6 V with a corresponding maximum voltage gain of 18. At T=77 K, even higher peak extrinsic transconductances of 622 mS/mm have been achieved at even lower bias voltage of $V_{ds}$=−0.2V, and thus far it is believed this 77 K transconductance is the highest valve ever reported for a p-type field-effect transistor.

Figure 11:
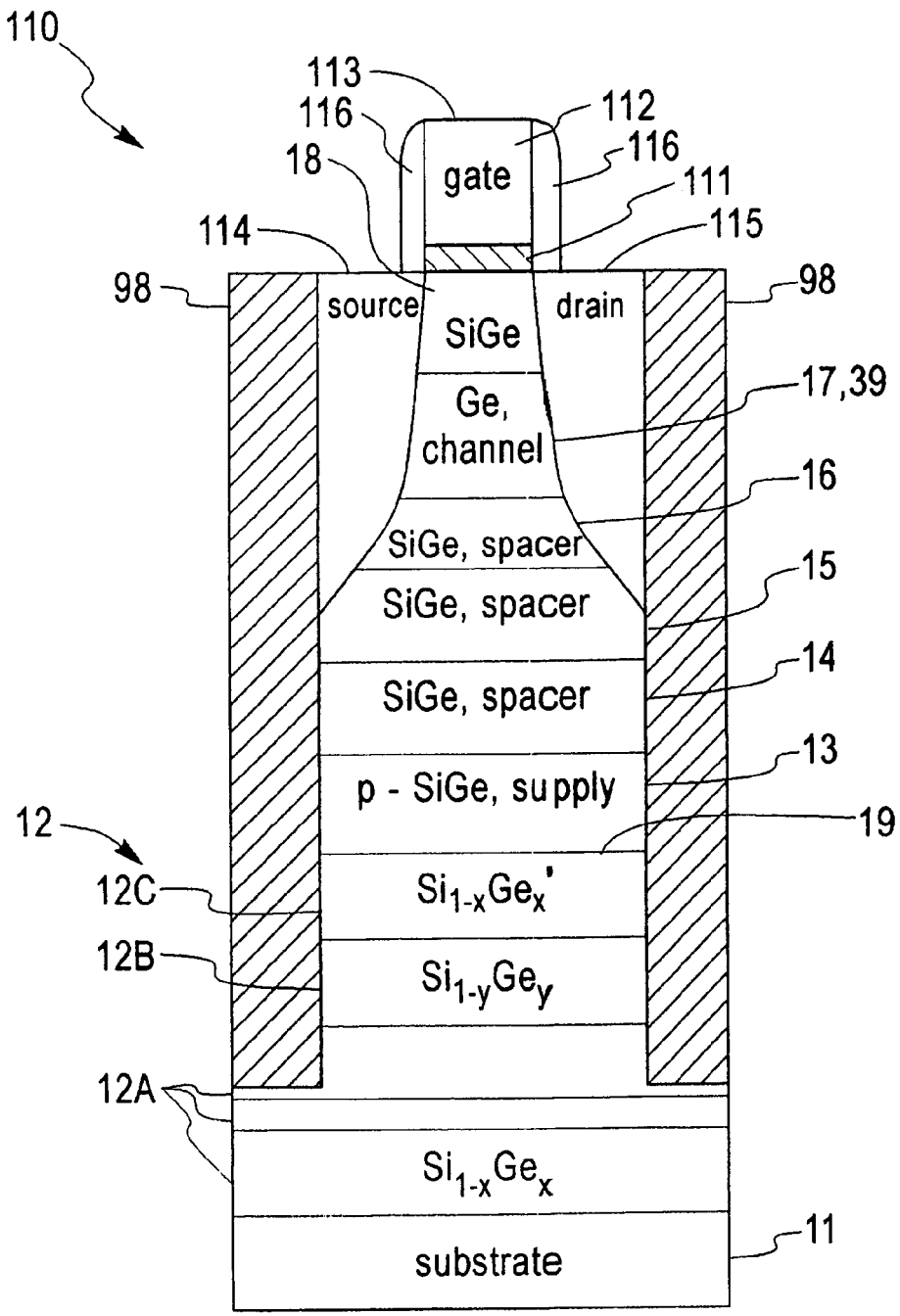
FIG. 11 is a cross section view of a Ge channel p-MOSFET incorporating the layered structure of FIG. 1.

A cross section view of a Ge channel p-type MOS-MODFET device 110 incorporating the layered structure of FIG. 1 is shown in FIG. 11. In FIG. 11, like references are used for functions corresponding to the apparatus of FIGS. 1 and 10. A gate dielectric 111 such as silicon dioxide, silicon oxynitride, silicon nitride, tantalum oxide, barium strontium titanate or aluminum oxide may be formed above SiGe layer 18. A polysilicon layer 112 may be formed over gate dielectric 111 and patterned to form gate electrode 113 for the device structure 110. Using gate electrode 113, source region 114 and drain region 115 may be formed by ion implantation on either side of the gate electrode 113 in the layered structure 110. Source and drain ohmic contacts (not shown) can be formed by standard metallization on the upper surface of source region 114 and drain region 115. A gate sidewall spacer 116 may be formed on either side of the gate electrode 113 prior to forming the ohmic contacts.

Figure 12:
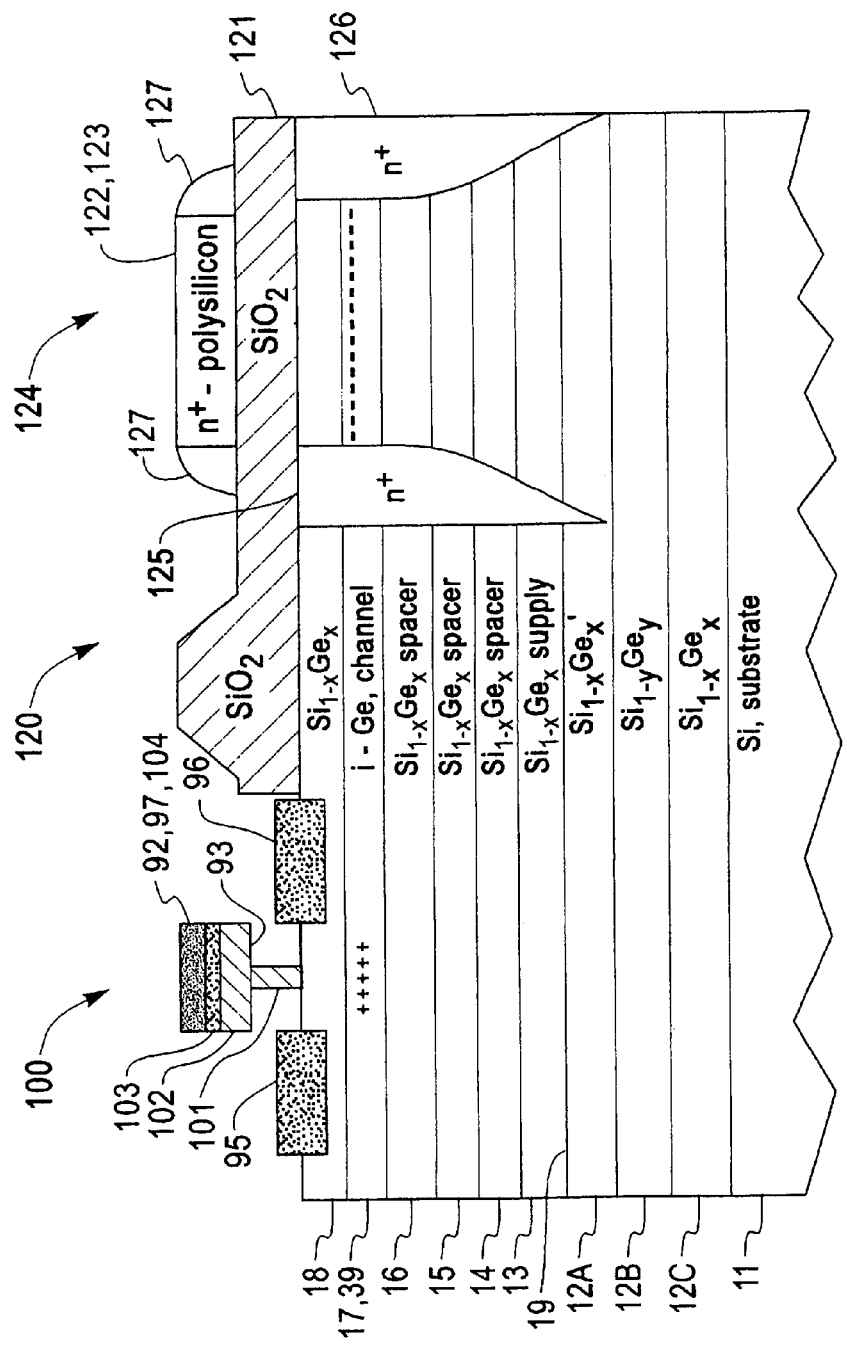
FIG. 12 is a cross section view of a Ge CMOS MODFET device incorporating the layered structure of FIG. 1.

A cross section view of a Ge complementary modulation doped (CMOD) FET device 120 is shown in FIG. 12. In FIG. 12, like references are used for functions corresponding to the apparatus of FIGS. 1 and 10. FIG. 12 shows p-MODFET device 100 which is also shown in FIG. 10. Adjacent p-MODFET device 100 is n-MOS-MODFET 124. A gate dielectric 121 such as silicon dioxide, silicon oxynitride, silicon nitride, tantalum oxide, barium strontium titanate or aluminum oxide may be formed above SiGe layer 18. An $n^+$ polysilicon layer 122 may be formed over gate dielectric 121 and patterned to form gate electrode 123 for the Ge n-MOS-MODFET device structure 124. Using gate electrode 123, $n^+$ source region 125 and $n^+$ drain region 126 may be formed by ion implantation on either side of the gate electrode 123 to form the Ge n-MOS-MODFET device structure 124. A gate sidewall spacer 127 may be formed on either side of the gate electrode 123 to complete the N-MOS-MODFET device structure 124. Source and drain ohmic contacts (not shown) can be patterned and formed by standard metallization on the upper surface of source region 125 and drain region 126.

Figure 13:
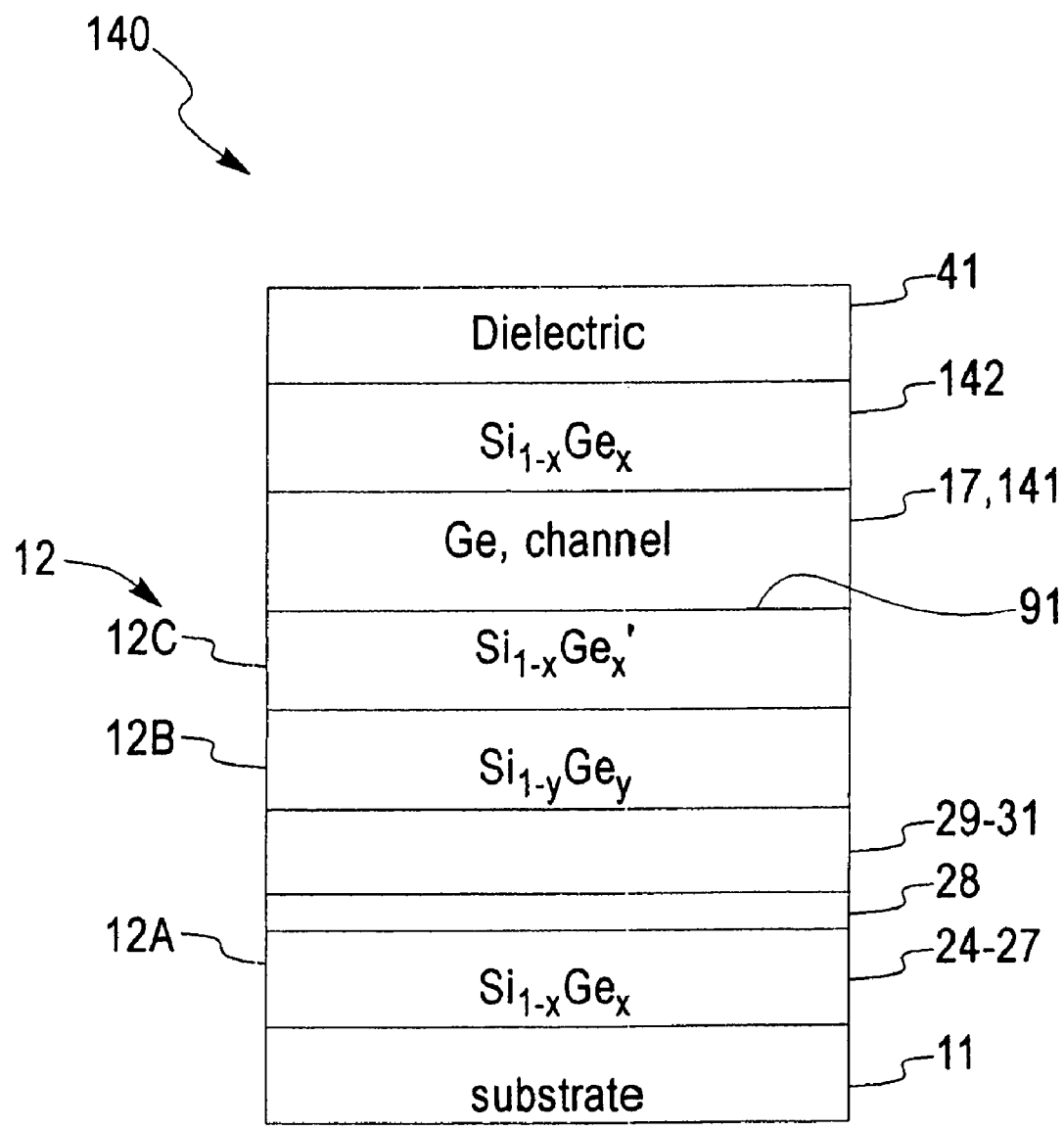
FIG. 13 is a cross section view of a layered structure illustrating a sixth embodiment of the invention.

In an alternate embodiment, a near surface Ge channel layered structure 140 is shown in FIG. 13 comprising of a Ge layer 17 formed above buffer layer 12, a SiGe layer 142 formed above channel 141, and a dielectric layer 41, for example, silicon dioxide formed over SiGe layer 142 to form a near surface Ge channel layered device structure 140. In FIG. 13, like references are used for functions corresponding to the apparatus of FIG. 1. In the near surface Ge channel layered structure suitable for CMOS devices, the active Ge channel 141 is first formed on layer 12C to form interface 91 and layer 17 is less than the critical thickness with respect to the lattice spacing at interface 91. Layer 17 functions as the channel region 141 of a field effect transistor. Above channel layer 141, an undoped SiGe layer 142 is formed which serves as a cap layer for forming the desired gate dielectric layer 41 in the device structure 140. To prevent the undoped SiGe layer 142 from being a parasitic channel for carriers such as electrons or holes, the preferred thickness for layer 142 is less than 1 nm. An example of a complementary Ge CMOS device structure which could be fabricated using standard process techniques is shown in FIG. 14.

Figure 13A:
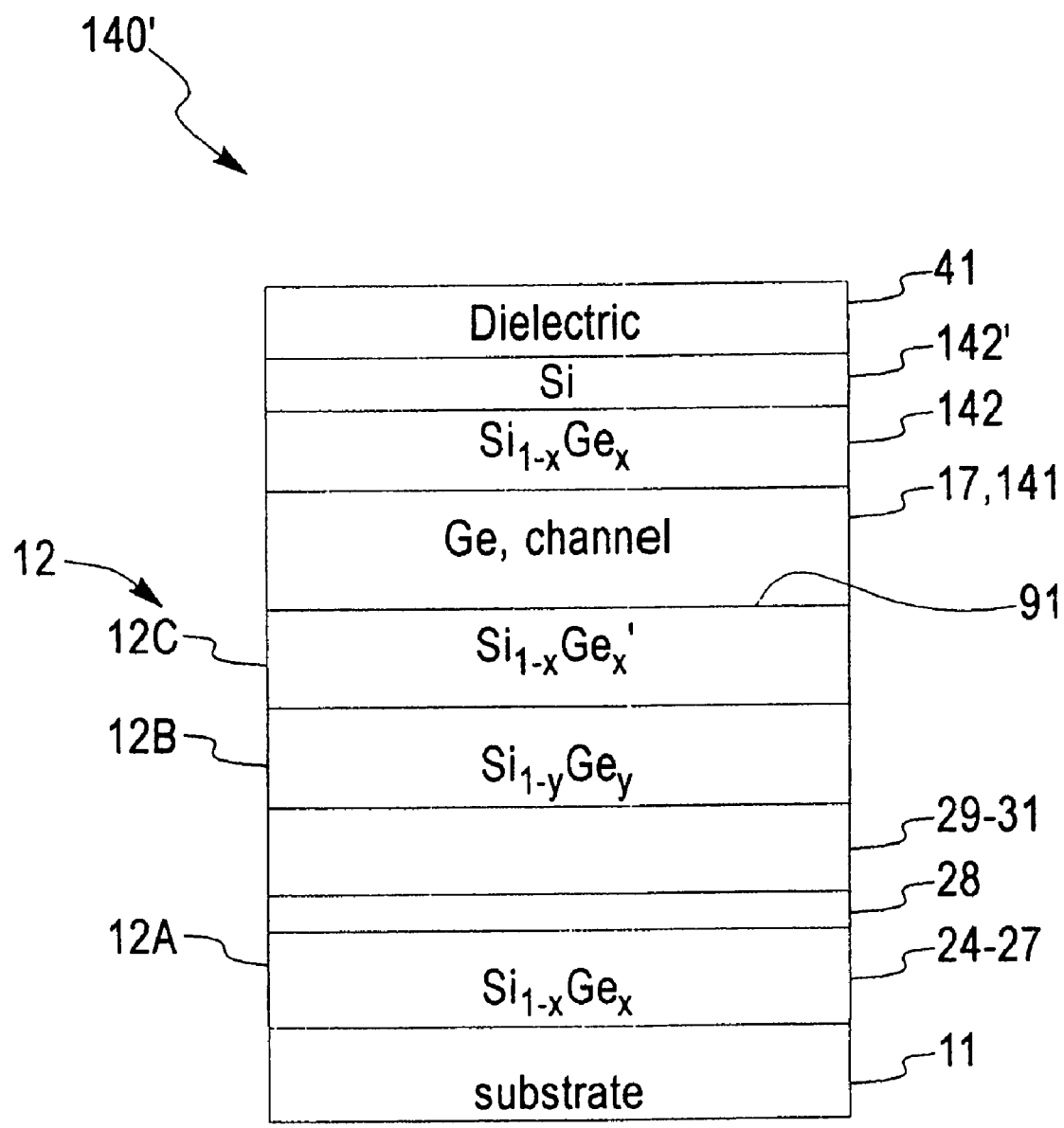
FIG. 13A is a cross section view of a layered structure illustrating a seventh embodiment of the invention.

FIG. 13A is a cross section view of a layered structure illustrating a modification of the embodiment shown in FIG. 13. In FIG. 13A, an additional Si layer 142' is epitaxially formed over SiGe layer 142. Gate dielectric layer 41 is formed over Si layer 142'.

Figure 14:
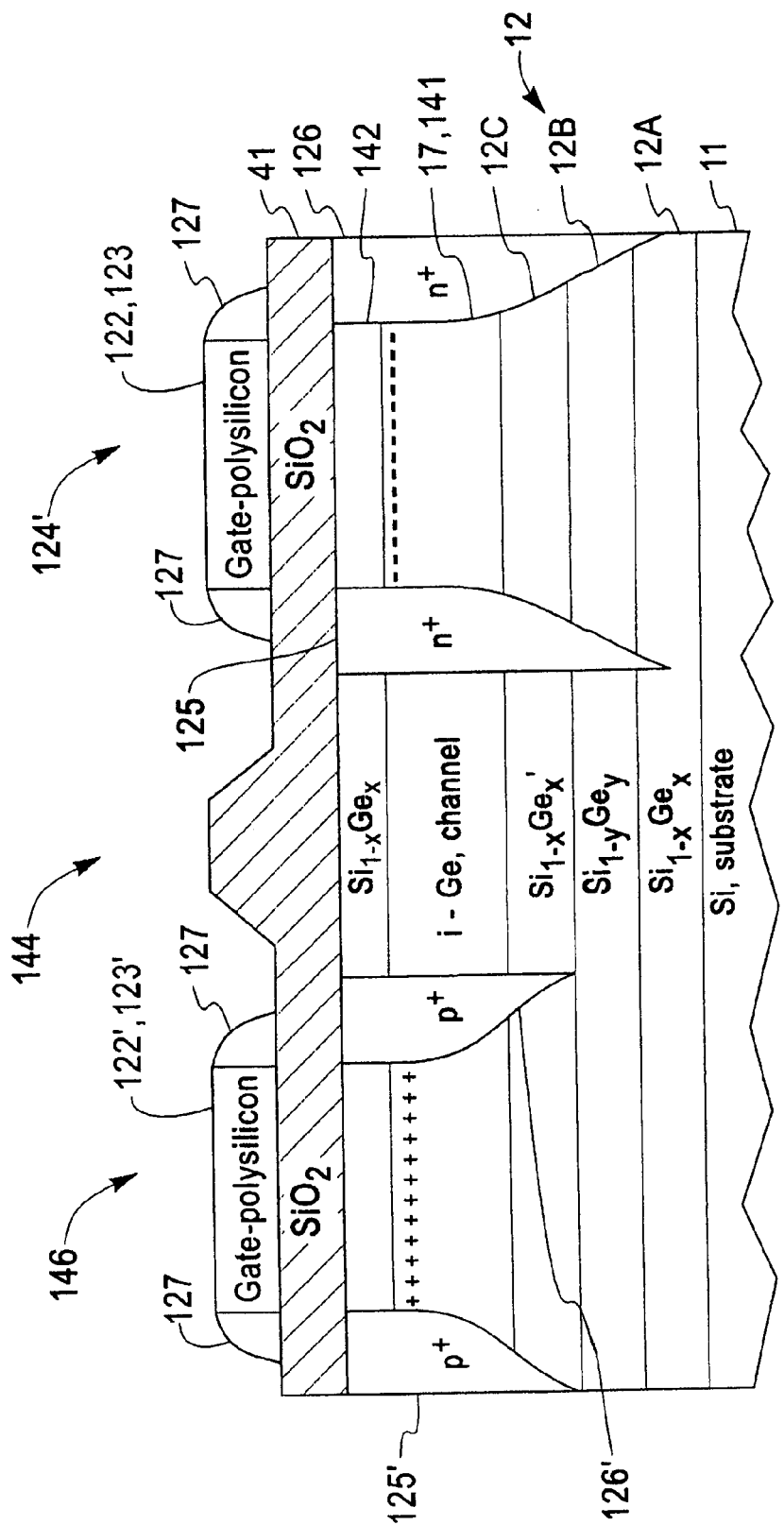
FIG. 14 is a cross section view of a Ge channel CMOS device structure for operating in an enhancement mode incorporating the layered structure of FIG. 13.

A cross section view of a Ge complementary metal oxide silicon (MOS) FET device 144 is shown in FIG. 14 for enhancement mode operation. In FIG. 14, like references are used for functions corresponding to the apparatus of FIGS. 1 and 12 and 13. A gate dielectric 41 such as silicon dioxide, silicon oxynitride, silicon nitride, tantalum oxide, barium strontium titanate (BST) or aluminum oxide may be formed above SiGe layer 142. A doped polysilicon layer 122' such as p+ may be formed over gate dielectric 41 and patterned to form gate electrode 123' for the Ge p-MOSFET device structure 146. Using gate electrode 123', p+ source region 125' and p+ drain region 126' may be formed by ion implantation on either side of the gate electrode 123' to form the Ge p-MOSFET device structure 146. A gate sidewall spacer 127 may be formed on either side of the gate electrode 123' to complete the p-MOSFET device structure 146. Source and drain ohmic contacts (not shown) can be patterned and formed by standard metallization on the upper surface of source region 125' and drain region 126'.

Adjacent p-MODFET device 146 is n-MODFET 124'. A gate dielectric 41 such as silicon dioxide, silicon oxynitride, silicon nitride, tantalum oxide, barium strontium titanate or aluminum oxide may be formed above SiGe layer 142. A doped such as n+ polysilicon layer 122 may be formed over gate dielectric 41 and patterned to form gate electrode 123 for the Ge n-MOSFET device structure 124'. Using gate electrode 123, n+ source region 125 and n+ drain region 126 may be formed by ion implantation on either side of the gate electrode 123 to form the Ge n-MOSFET device structure 124'. A gate sidewall spacer 127 may be formed on either side of the gate electrode 123 to complete the p-MOSFET device structure 124. Source and drain ohmic contacts (not shown) can be patterned and formed by standard metallization on the upper surface of source region 125 and drain region 126. Device isolation regions such as field regions 98 or deep trenches shown in FIGS. 10 and 11 may be formed to separate the p-MOSFET device structure 146 from the n-MOSFET device structure 124'.

Figure 15:
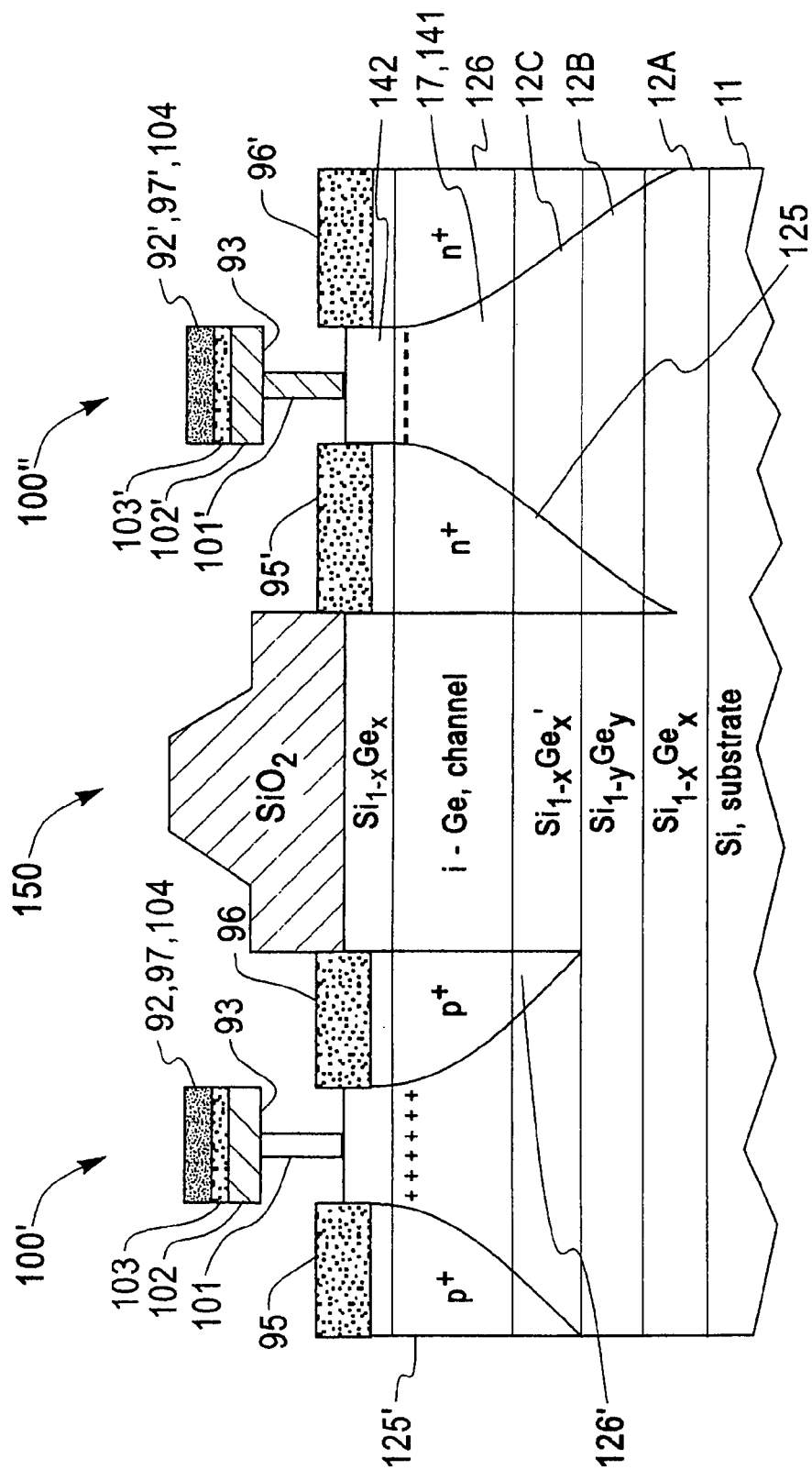
FIG. 15 is a cross section view of a Ge channel CMOS device structure having Schottky barrier metal gates.

FIG. 15 is a cross section view of a Ge complementary modulation doped (CMOD) FET device 150 having Schottky barrier metal gates for enhancement mode operation. In FIG. 15, like references are used for functions corresponding to the apparatus of FIGS. 1, 10 and 12-14. In FIG. 15, ohmic contacts 95 and 96 are in ohmic contact to source region 125 and drain region 126, respectively, which may be formed by ion implantation to form p+ regions and are self aligned with respect to gate stack 97. Materials for transistor 100' are selected to function as a p-channel enhancement mode FET. Ohmic contacts 95' and 96' are in ohmic contact to source region 125' and drain region 126, respectively, which may be formed by ion implantation to form n-regions and are self aligned with respect to gate stack 97'. Materials for transistor 100" are selected to function an n-channel enhancement mode FET. While not shown, field region 98 as shown in FIG. 10 or shallow trench isolation (STI) may be used to provide isolation between transistors 100' and 100".

With respect to transistors 100' and 100", buried doped regions may be formed below the gate electrode and channel to adjust the threshold voltage and to reduce any parasitic currents from the adjacent device as well as from the body of the above the buried doped region.

It should be noted that in the drawing like elements or components are referred to by like and corresponding reference numerals.

While there has been described and illustrated Ge/SiGe/Si layered structures having a strained Ge channel under compression suitable for HEMT's, MOD FET'S, CMOS FET'S and CMOD FET's, it will be apparent to those skilled in the art that modifications and variations are possible without deviating from the broad scope of the invention which shall be limited solely by the scope of the claims appended hereto.

What is claimed is:

1. A layered structure for forming a Ge channel field effect transistor comprising:
    a single crystalline substrate,
    a first layer of relaxed $Si_{1-x}Ge_x$ formed epitaxially on said substrate where Ge fraction x is in the range from 0.5 to 0.8,
    a second layer of Ge formed epitaxially on said first layer whereby said second layer is under compressive strain,
    a third layer of undoped $Si_{1-x}Ge_x$ formed epitaxially on said second layer,
    a fourth layer of undoped Si formed epitaxially on said third layer, and
    a fifth layer of gate dielectric formed on said fourth layer.

2. The layered structure of claim 1 further including first and second over-shoot layers, $Si_{1-m}Ge_m$ and $Si_{1-n}Ge_n$, within a strain relief structure of said first layer of relaxed $Si_{1-x}Ge_x$ for the case when x is greater than 0.5.

3. The layered structure of claim 2 wherein said first over-shoot layer, $Si_{1-m}Ge_m$, within said strain relief structure of said first layer has a Ge fraction m, where m is the range from 0.05 to less than 0.5.

4. The layered structure of claim 2 wherein said second over-shoot layer, $Si_{1-n}Ge_n$, within the strain relief structure of said first layer has a Ge fraction n, where n=x+z and z is in the range from 0.01 to 0.1.

5. The layered structure of claim 1 wherein further comprising an active device region said active device region is a buried channel made up of an epitaxial Ge channel of said second layer having a higher compressive strain to provide a deeper quantum well or a higher baffler for better hole confinement with no alloy scattering as compared to a single SiGe layer channel device alone.

6. The layered structure of claim 1 wherein said second layer is formed at temperatures where 3D growth of Ge films does not occur to generate interface roughness problems and at a temperature range from 275°-350° C. where 2D growth of Ge films does occur.

7. The layered structure of claim 1 wherein the Ge content of said third layer of $Si_{1-x}Ge_x$ is in the range from 0.5 to 0.8.

8. The layered structure of claim 1 wherein the Ge content x may be graded within said third layer starting with a higher Ge content nearer said second layer and grading down in Ge content towards the upper surface of said third layer to a value of about 0.30.

9. The layered structure of claim 1 wherein said fourth layer is a dielectric material selected from the group consisting of silicon dioxide, silicon oxynitride, silicon nitride, tantalum oxide, barium strontium titanate, aluminum oxide and combinations thereof.

10. The layered structure of claim 1 wherein said third layer of $Si_{1-x}Ge_x$ may be substituted with a thin strained commensurate Si layer suitable for high temperature oxidation in formation of a high quality silicon dioxide layer in said fourth layer of gate dielectric.

11. The layered structure of claim 1 wherein said fourth layer of Si is under tensile.

12. The layered structure of claim 1 further including, electrical isolation regions created by the selective removal of at least said fifth layer a gate electrode formed on said gate dielectric of said fifth layer, a source electrode formed and located on one side of said gate electrode, and a drain electrode formed and located on the other side of said gate electrode whereby a field-effect transistor structure is formed.

* * * * *